(12) United States Patent
Kim et al.

(10) Patent No.: US 8,270,211 B2
(45) Date of Patent: *Sep. 18, 2012

(54) ELECTROMECHANICAL SWITCH AND METHOD OF FORMING THE SAME

(75) Inventors: Min-Sang Kim, Seoul (KR); Ji-Myoung Lee, Yongin-si (KR); Hyun-Jun Bae, Suwon-si (KR); Dong-Won Kim, Seongnam-si (KR); Jun Seo, Suwon-si (KR); Weonwi Jang, Seoul (KR); Keun-Hwi Cho, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/082,605

(22) Filed: Apr. 8, 2011

(65) Prior Publication Data

US 2011/0182111 A1    Jul. 28, 2011

Related U.S. Application Data

(62) Division of application No. 12/392,780, filed on Feb. 25, 2009, now Pat. No. 7,929,341.

(30) Foreign Application Priority Data

Mar. 24, 2008  (KR) .............................. 2008-0026812
Aug. 29, 2008  (KR) .............................. 2008-0085041

(51) Int. Cl.
*G11C 11/50* (2006.01)

(52) U.S. Cl. ........................................ 365/166; 365/149

(58) Field of Classification Search .................. 365/149, 365/166

See application file for complete search history.

(56) References Cited

U.S. PATENT DOCUMENTS

| | | | | |
|---|---|---|---|---|
| 6,016,279 A * | 1/2000 | Chi | ................................ | 365/203 |
| 6,115,231 A * | 9/2000 | Shirakawa | .................... | 361/233 |
| 6,185,125 B1 * | 2/2001 | Yang | .............................. | 365/149 |
| 6,307,169 B1 * | 10/2001 | Sun et al. | ....................... | 200/181 |
| 2009/0003039 A1 * | 1/2009 | Naito | ............................. | 365/151 |

* cited by examiner

*Primary Examiner* — Hoai V Ho
*Assistant Examiner* — Jay Radke
(74) *Attorney, Agent, or Firm* — F. Chau & Associates, LLC

(57) ABSTRACT

A memory device includes a storage node, a first electrode, and a second electrode formed in a memory cell, the storage node stores electrical charges, the first electrode comprising a first portion electrically connected to a second portion, the first portion moves to connect to the storage node when the second electrode is energized.

32 Claims, 41 Drawing Sheets

ELECTROMECHANICAL SWITCH AND METHOD OF FORMING THE SAME

CROSS REFERENCE TO RELATED APPLICATIONS

This application is a Divisional Application of U.S. patent application Ser. No. 12/392,780 filed on Feb. 25, 2009, now U.S. Pat. No. 7,929,341 which claims priority to Korean patent applications 2008-0026812 filed on Mar. 24, 2008 and 2008-0085041 filed on Aug. 29, 2008, the contents of which are herein incorporated by reference in their entirety.

TECHNICAL FIELD

The present disclosure relates to an electromechanical switch and a method of forming the same, and more particularly to an electromechanical switch having an electrode movably connected to a storage node and a method of forming the same.

DISCUSSION OF RELATED ART

Dynamic RAM (DRAM) is a solid state memory that requires refreshing to keep the data active. A memory cell in DRAM includes a capacitor and MOS transistor. The capacitor's charge decays, due to leakage, so the system must periodically refresh the charge to maintain the value. The MOS transistor acts as a switch in the memory cell. If the memory is to be read, the voltage on the capacitor is detected on the data line by a sense amplifier. If a write or refresh operation is called for, the data line becomes an input line. When the proper address turns on the MOS transistor in the DRAM cell, the capacitor can be charged or recharged from data-in.

One way to increase the density of the DRAM is by reducing the size of the MOS transistors. However, reducing the size of MOS transistors raises other issues such as short channel or junction leakage. Another way to increase the density of the DRAM is by stacking multiple layers of memory cells one over another. However, when a MOS transistor is used in a memory cell, a semiconductor substrate must be used to accommodate the MOS transistor thereon, and the semiconductor substrate must be formed between upper and lower arrays of memory cells having the MOS transistors. A respective semiconductor substrate formed between the multiple layers of memory cells increases a thickness of the DRAM.

A need therefore exists for an improved switching device for use in a memory device.

SUMMARY OF THE INVENTION

According to an exemplary embodiment of the present invention, a memory device comprises a storage node, a first electrode, and a second electrode formed in a memory cell, the storage node stores electrical charges, the first electrode comprising a first portion electrically connected to a second portion, the first portion moves to connect to the storage node when the second electrode is energized.

The electrical charges received from the storage node can transfer through the first portion to a voltage sensing circuit connected to an end of the second portion.

The first portion and the second portion can be connected through a contact plug.

A first end of the first portion can move from a first position to a second position for reading out the electrical charges stored within the storage node or for writing the electrical charges to the storage node.

The first end of the first portion can be in the second position to contact the storage node when the second electrode is energized.

A second end of the first portion can be anchored on the contact plug.

A first distance between the first position and the second position can be substantially the same as a second distance between the second electrode and a corresponding first portion of the first electrode.

A first distance between the first position and the second position can be smaller than a second distance between the second electrode and a corresponding first portion of the first electrode.

The first portion may comprise a first layer and a second layer, the first layer comprising a different material from the second layer.

The first portion can be substantially shorter than the second portion.

The second electrode can be energized when a voltage is applied.

The memory device may further comprise a substrate on which the second portion is formed, wherein the substrate comprises at least one of glass, semiconductor, or plastic.

The storage node may comprise a capacitor including a third electrode, a dielectric layer, and a fourth electrode.

The third electrode can receive the first end of the first portion and the fourth electrode can be formed on a conductive plate.

The storage node can comprise a conductive pattern surrounded by an insulator.

The memory device can further comprise a conductive plate on which the storage node is formed.

The first electrode can be a bit line and the second electrode can be a word line.

According to an exemplary embodiment of the present invention, a memory device comprises a first memory cell having a first word line and a first storage node that stores a first charge, a second memory cell having a second word line and a second storage node that stores a second charge, a bit line having a first portion formed in the first memory cell and a second portion formed in the second memory cell, a beam line formed having a first portion in the first memory cell and a second portion formed in the second memory cell, the beam line is electrically connected to the bit line, wherein an end of the first portion of the beam line moves to connect to the first storage node when the first word line is energized, and an end of the second portion of the beam line moves to connect to the second storage node when the second word line is energized.

The bit line and the beam line can be connected through a contact plug.

A center of the beam line can be anchored on the contact plug.

The beam line can be substantially symmetrical with respect to the contact plug.

The first charge received from the first storage node can be transferred through the beam line to a voltage sensing circuit connected to an end of the bit line.

The end of the first portion of the beam line can move from a first position to a second position for reading out the first charge stored within the first storage node or for writing the first charge to the first storage node.

The end of the first portion of the beam line can be in the second position to contact the first storage node when the first word line is energized.

A first distance between the first position and the second position can be substantially the same as a second distance between the first word line and a corresponding portion of the beam line.

A first distance between the first position and the second position can be smaller than a second distance between the first word line and a corresponding portion of the beam line.

The beam line can comprise a first layer and a second layer, the first layer comprising a different material from the second layer.

The beam line can be substantially shorter than the bit line.

The first word line can be energized when a voltage is applied.

The memory device may further comprise a substrate on which the bit line is formed, wherein the substrate comprises at least one of glass, semiconductor, or plastic.

The first storage node can comprise a capacitor including a first electrode, a dielectric layer, and a second electrode.

The first electrode can receive the end of the first portion of the beam line and the second electrode can be formed on a conductive plate.

The first storage node can comprise a conductive pattern surrounded by an insulator.

The memory device may further comprise a conductive plate on which the first storage node is formed.

According to an exemplary embodiment of the present invention, a memory device comprises a first pair of memory cells connected to a bit line, the first pair of memory cells having a first beam line, a second pair of memory cells formed adjacent to the first pair of memory cells and connected to the bit line, the second pair of memory cells having a second beam line, wherein each of the beam lines moves to connect to a respective storage node that stores a charge when a respective word line is energized.

The bit line and each of the beam lines can be electrically connected through a respective contact plug.

Each of the beam lines can be anchored on the respective contact plug.

Each of the beam lines can be substantially symmetrical with respect to the respective contact plug.

The charge received from the respective storage node can transfer through each of the beam lines to a voltage sensing circuit connected to an end of the bit line.

An end of each of the beam lines can move from a first position to a second position for reading out the charge stored within the respective storage node or for writing the charge to the respective storage node.

The end of each of the beam lines can be in the second position to contact the respective storage node when the respective word line is energized.

A first distance between the first position and the second position can be substantially the same as a second distance between the respective word line and a corresponding portion of each of the beam lines.

A first distance between the first position and the second position can be smaller than a second distance between the respective word line and a corresponding portion of each of the beam lines.

Each of the beam lines can comprise a first layer and a second layer, the first layer comprising a different material from the second layer.

Each of the beam lines can be substantially shorter than the bit line.

The respective word line can be energized when a voltage is applied.

The memory device may further comprise a substrate on which the bit line is formed, wherein the substrate comprises at least one of glass, semiconductor, or plastic.

The respective storage node can comprise a capacitor including a first electrode, a dielectric layer, and a second electrode.

The first electrode can receive the end of each of the beam lines and the second electrode is formed on a conductive plate.

The respective storage node can comprise a conductive pattern surrounded by an insulator.

The memory device may further comprise a conductive plate on which the respective storage node is formed.

According to an exemplary embodiment, a memory device comprises a substrate, a bit line formed on the substrate, a word line formed on the bit line, a beam line formed over the word line, a capacitor storing a charge, the capacitor formed between the beam line and the substrate, and the beam line moves to connect to the capacitor when the word line is energized.

The memory device may further comprise a contact plug connecting the bit line and the beam line.

The memory device may further comprise a first interlayer dielectric layer having a plurality of pores formed on the beam line.

The memory device may further comprise a second interlayer dielectric layer formed on the first interlayer dielectric layer.

A first end of the beam line can move from a first position to a second position for reading out the charge stored within the capacitor or for writing the charge to the capacitor.

The first end of the beam line can be in the second position to contact the capacitor when the word line is energized.

A second end of the beam line can be anchored on the contact plug.

A first distance between the first position and the second position can be substantially the same as a second distance between the word line and a corresponding portion of the beam line.

A first distance between the first position and the second position can be smaller than a second distance between the word line and a corresponding portion of the beam line.

The beam line can comprise a first layer and a second layer, the first layer comprising a different material from the second layer.

The beam line can be substantially shorter than the bit line.

The word line can be energized when a voltage is applied.

The substrate may comprise at least one of glass, semiconductor, or plastic.

The capacitor may include a first electrode, a dielectric layer, and a second electrode.

The first electrode can receive the first end of the beam line and the second electrode can be formed on a conductive plate.

The memory device may further comprise a conductive plate on which the capacitor is formed.

According to an exemplary embodiment of the present invention, a method of forming a memory device comprises forming a bit line of first cells on a substrate, forming a word line over the bit line, forming a beam line over the word line with a first gap therebetween, electrically connecting the bit line and the beam line, forming a capacitor between an end portion of the beam line and the substrate, the end portion of the beam line and a top surface of the capacitor having a second gap, forming an interlayer insulating layer over the beam line, and forming a bit line of second cells on the interlayer insulating layer.

The first gap can be substantially the same as the second gap.

The second gap can be smaller than the first gap.

According to an exemplary embodiment of the present invention, a method of forming a memory device comprises forming a first conductive layer on a substrate, patterning the first conductive layer to form a transistor in a peripheral region of the substrate and to form a bit line in a cell region of the substrate, forming a first interlayer dielectric layer on the transistor and the bit line, forming a capacitor on the first interlayer dielectric layer in the cell region, forming a first contact plug through the first interlayer dielectric layer in the peripheral region, and a second contact plug through the first interlayer dielectric layer in the cell region, forming a second conductive layer on the first contact plug, on the second contact plug, and on the capacitor, patterning the second conductive layer to form a word line in the cell region, forming a first sacrificial layer over the word line, forming a beam line over the first sacrificial layer, forming a second sacrificial layer over the beam line, and removing the first and second sacrificial layers.

The method may further comprise forming a second interlayer dielectric layer having a plurality of pores over the second sacrificial layer.

Removing the first and second sacrificial layers may comprise flowing etching chemicals through the plurality of pores.

The method may further comprise forming a third interlayer dielectric layer over the second interlayer dielectric layer.

The first sacrificial layer can have a varied thickness. The first sacrificial layer can have a consistent thickness.

BRIEF DESCRIPTION OF DRAWINGS

Exemplary embodiments of the present invention can be understood in more detail from the following descriptions taken in conjunction with the accompanying drawings, in which.

DESCRIPTION OF EXEMPLARY EMBODIMENTS

The present invention will now be described more fully with reference to the accompanying drawings in which example embodiments of the invention are shown. This invention may, however, be embodied in many different forms and should not be construed as limited to the exemplary embodiments set forth herein.

Figure 1:
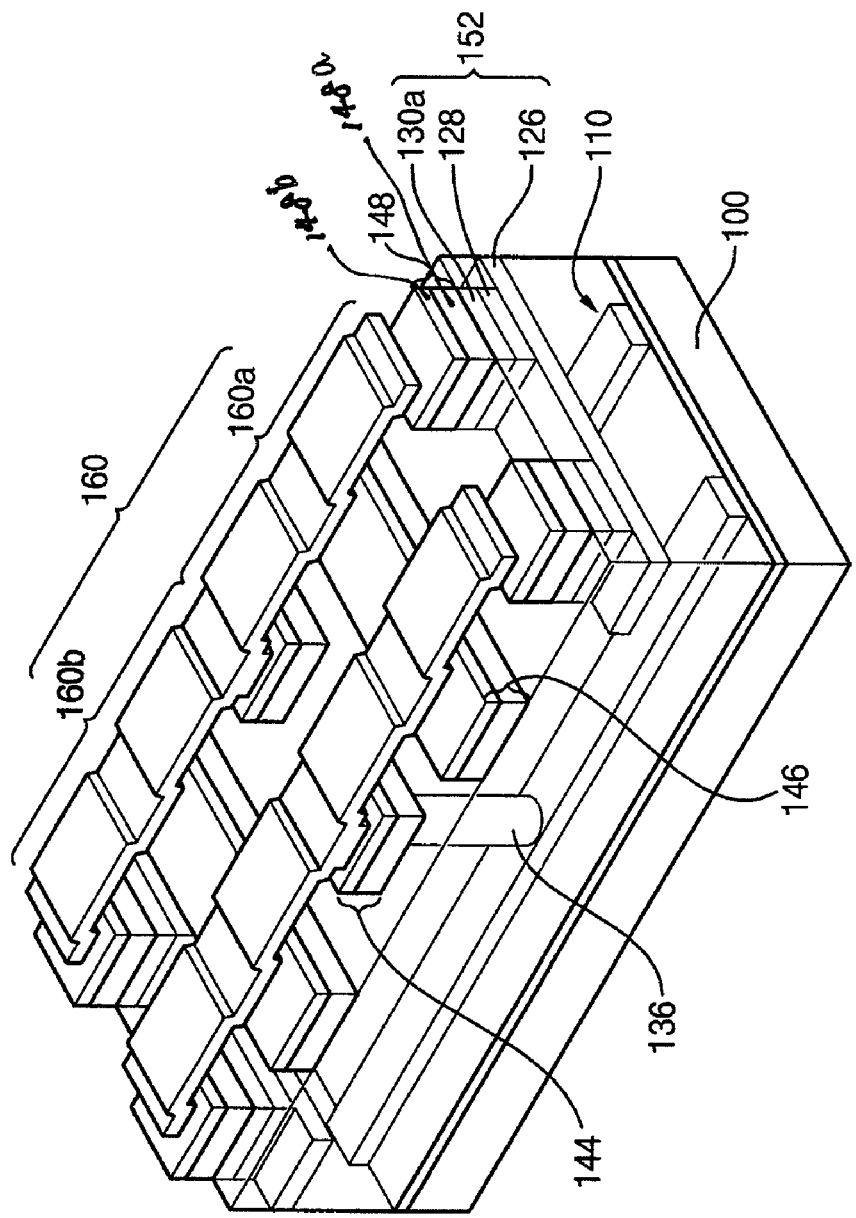
FIG. 1 is a perspective view showing an electromechanical switch according to an exemplary embodiment of the present invention.

FIG. 1 is a perspective view showing an electromechanical switch according to an exemplary embodiment of the present invention. The electromechanical switch can be used in a memory cell constituting a memory device such as, for example, a Dynamic Random Access Memory (DRAM). The electromechanical switch can also be used in electronic devices other than the memory device.

Referring to FIG. 1, an electromechanical switch includes a first electrode and a second electrode disposed in a memory cell. The first electrode can be a word line 146 and the second electrode can be a beam line including a suspended beam line 160 and a buried bit line 110. The word line 146 is disposed between the suspended beam line 160 and the buried bit line 110. The buried bit line 110 is electrically connected to the suspended beam line 160 through a direct contact such as, for example, a contact plug 136. The buried bit line 110 is disposed on the substrate 100. The substrate 100 may comprise, for example, glass, semiconductor or plastic.

In an exemplary embodiment, the suspended beam line 160 includes first and second flexible extensions 160a and 160b extended in opposite directions. The first and second flexible extensions 160a and 160b are disposed on and anchored with respect to the contact plug 136. In an exemplary embodiment, a conductive pattern 144 can be formed between the suspended beam line 160 and the contact plug 136. The suspended beam line 160 can be substantially symmetrical with respect to the contact plug 136. A length of the first flexible extension 160a can be substantially the same as a length of the second flexible extension 160b. A length of the suspended beam line 160 is substantially smaller than a length of the buried bit line 110.

In an exemplary embodiment, the movement of the first flexible extension 160a does not affect the movement of the second flexible extension 160b. For example, the first flexible extension 160a can move downwardly while the second flexible extension 160b does not move. The first and second flexile extensions 160a and 160b can be substantially straight. Alternatively, the first and second flexible extensions 160a and 160b can be curved, or can have a plurality of recessed and protruding portions conforming to the pattern of the surface disposed under the first and second flexible extensions 160a and 160b.

In an exemplary embodiment, the suspended beam line 160 comprises a first layer and a second layer. The first layer can be laminated on the second layer. The first layer and the second layer can comprise the same material or can be made from different materials. For example, the first layer may comprise a silicon oxide ($SiO_2$) layer or a silicon nitride (SiN) layer, and the second layer may comprise a tantalum-based conductive material such as Ta or TaN. The suspended beam line 160 having two layers with different materials can be more flexible as compared to a suspended beam line comprising a single material layer.

Between the first flexible extension 160a and the buried bit line 110, a storage node is disposed. The storage node is an electrical node of a charge storing device. When electrically connected, electrical charges can move through the first flexible extension 160a and the contact plug 136 to a voltage sensing circuit connected to an end of the buried bit line 110. In an exemplary embodiment, the storage node can be an electrical node of a capacitor 152. Alternatively, the storage node can be a node of a conductive pattern surrounded by an insulator. The capacitor 152 includes an upper electrode 130a, a lower electrode 126, and a dielectric layer 128 disposed between therebetween.

The capacitor 152 can be disposed near a first end of the first flexible extension 160a. The second end of the first flexible extension 160a is disposed on the contact plug 136. The upper electrode 130a can have, for example, a substantially rectangular shape. The first end of the first flexible extension 160a can contact the upper electrode 130a. In an exemplary embodiment, the first end of the first flexible extension 160a contacts substantially a center portion of the upper electrode 130a. The contact can be a point, line or surface contact between the first end of the first flexible extension 160a and the upper electrode 130a. In an exemplary embodiment, a conductive pad pattern 148 can be formed on the upper electrode 130a.

With regard to the vertical direction, the word line 146 can be disposed between the first flexible extension 160a and the buried bit line 110. With regard to the horizontal direction, the word line 146 can be disposed between the second end of the first flexible extension 160a and the capacitor 152. When the word line 146 is energized, the first end of the first flexible extension 160a is movably connected to the capacitor 152. In an exemplary embodiment, the first flexible extension 160a can be connected to the capacitor 152 through the conductive pad pattern 148. The word line 146 can be energized when a voltage is applied. When the word line 146 pulls the first flexible extension 160a, a distance between the word line 146 and the first flexible extension 160a becomes closer, but the word line 146 and the first flexible extension 160a do not contact each other. However, the first end of the first flexible extension 160a contacts the upper electrode 130a of the capacitor 152, or contacts the conductive pad pattern 148 formed on the upper electrode 130a. In a data write operation, the capacitor 152 is charged with electrons through the contact. Similarly, in a data read operation, the word line 146 pulls the first flexible extension 160a and the first end of the first flexible extension 160a contacts the upper electrode 130a, or contacts the conductive pad pattern 148 formed on the upper electrode 130a. With the contact, the bit line senses the existence of electrons in the capacitor 152.

A second memory cell corresponding to the second flexible extension 160b can be a mirror image of the first memory cell corresponding to the first flexible extension 160a. For example, the second flexible extension 160b contacts a capacitor when a word line pulls the second flexible extension 160b. As such, the first flexible extension 160a is movably connected to the capacitor 152 when the word line 146 is energized, and the second flexible extension 160b is movably connected to another capacitor formed thereunder when the word line corresponding to the second flexible extension 160b is energized.

A first pair of memory cells includes a first memory cell corresponding to the first flexible extension 160a and a second memory cell corresponding to the second flexible extension 160b. A second pair of memory cells having the substantially same structure of the first pair of memory cell can be formed adjacent the first pair of memory cells. The first pair and the second pair of the memory cells can be connected through the buried bit line 110. As such, along the buried bit line 110, more than one pairs of memory cells can be connected, for example, in a regular interval. In the word line direction, more than one pairs of memory cells having the symmetrical extensions can be disposed, for example, in a regular interval.

Figure 2:
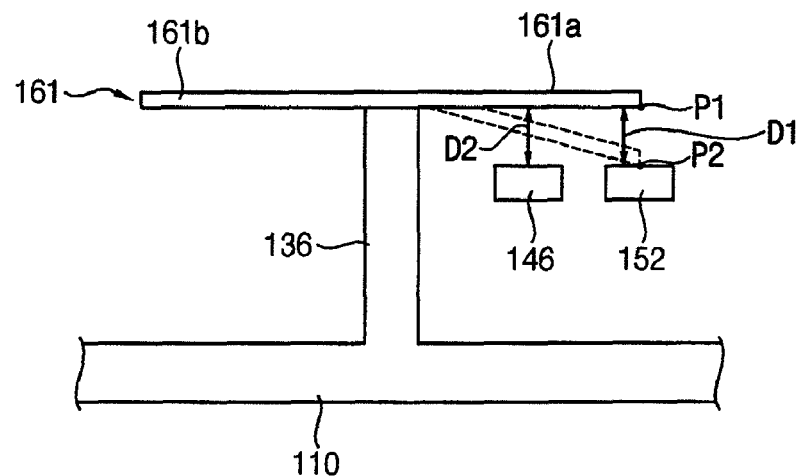
FIG. 2 shows a movable portion of an electromechanical switch according to an exemplary embodiment of the present invention.

FIG. 2 is a schematic view showing a movable portion of an electromechanical switch according to an exemplary embodiment of the present invention.

Referring to FIG. 2, the first end of the first flexible extension 161a moves from a first position P1 to a second position P2 for reading out the charge stored within the capacitor 152 or for writing the charge to the capacitor 152. The first end of the first flexible extension 161a is in the second position P2 to contact the capacitor 152 when the word line 146 is energized. In an exemplary embodiment, a first distance D1 between the first position P1 and the second position P2 is substantially the same as a second distance D2 between the word line 146 and a corresponding portion of the first flexible extension 161a disposed over the word line 146. In an exemplary embodiment, the first distance D1 and the second distance D2 can be about 10 nm to about 15 nm.

Figure 3:
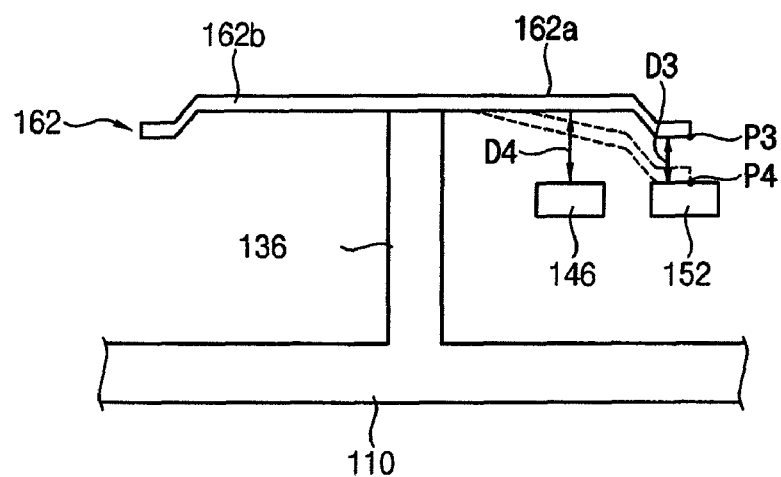
FIG. 3 shows a movable portion of an electromechanical switch according to an exemplary embodiment of the present invention.

FIG. 3 is a schematic view showing a movable portion of an electromechanical switch according to an exemplary embodiment of the present invention.

Referring to FIG. 3, the suspended beam line 162 includes a first flexible extension 162a and a second flexible extension 162b. In an exemplary embodiment, a first distance D3 between the first position P3 and the second position P4 is smaller than a second distance D4 between the word line 146 and a corresponding portion of the first flexible extension 162a disposed over the word line 146. In an exemplary embodiment, the first distance D3 can be about 10 nm to about 15 nm and the second distance D4 can be about 20 nm to about 25 nm. The first flexible extension 162a can be prevented from contacting the word line 146 when the word line 146 pulls the first flexible extension 162a because D4 is larger than D3. That is, when D3 is zero, D4 still can maintain a distance. If the word line 146 contacts the first flexible extension 162a, damage may occur in the word line 146 and/or the first flexible extension 162a. An operation voltage of the memory device can be lowered to maintain a minimum distance in D4.

Figure 4:
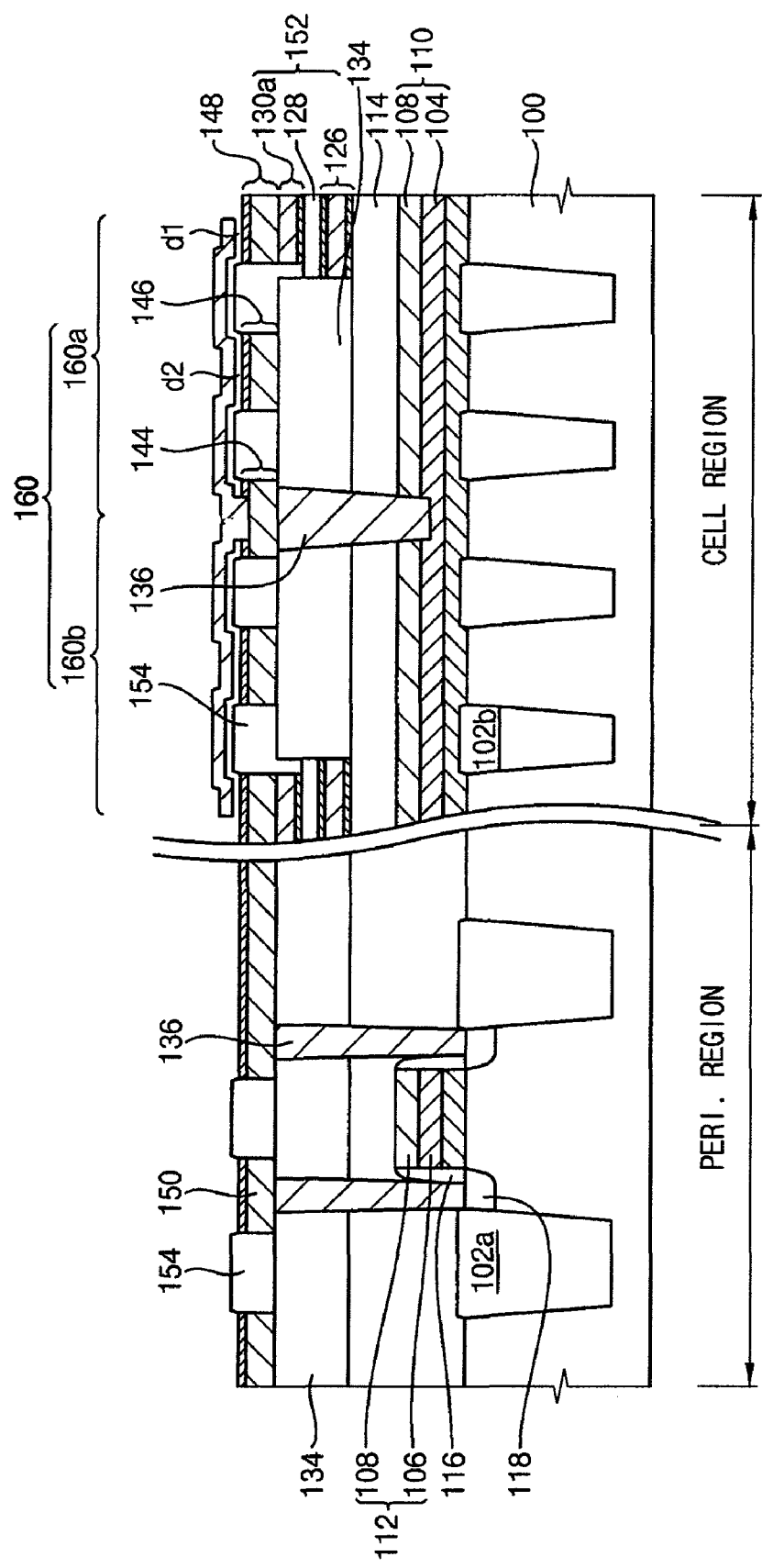
FIG. 4 is a cross-sectional view of a memory device including a MOS transistor in a peripheral region and an electromechanical switch in a cell region according to an exemplary embodiment of the present invention.

FIG. 4 is a cross-sectional view of a memory device including a metal oxide silicon (MOS) transistor formed in a peripheral region and an electromechanical switch formed in a cell region according to an exemplary embodiment of the present invention.

Referring to FIG. 4, in the cell region, trench isolations 102b are formed in the substrate 100. The substrate 100 can be a semiconductor substrate. The buried bit line 110 is formed on the trench isolations 102b and the substrate 100. The buried bit line 110 includes a conductive pattern 104 and a mask pattern 108 formed on the conductive pattern 104. A first interlayer dielectric layer 114 is formed on the buried bit line 110. The contact plug 136 is formed through the first interlayer dielectric layer 114 and contacts the conductive pattern 104 of the buried bit line 110. The conductive pad pattern 144 can formed on the contact plug 136. The suspended beam line 160 can be formed on the conductive pad pattern 144. The word line 146 is formed between the suspended beam line 160 and a second interlayer dielectric layer 134 disposed on the first interlayer dielectric layer 114. The second distance d2 exists between the word line 146 and the first flexible extension 160a. The capacitor 152 is formed between near the end of the suspended beam line 160 and the first interlayer dielectric layer 114. In an exemplary embodiment, the conductive pad pattern 148 can be formed on the capacitor 152. A first distance d1 exists between the suspended beam line 160 and the conductive pad pattern 148. The first and second distances d1 and d2 are substantially the same when the word line 146 is not energized.

In the peripheral region, trench isolations 102a are formed in the substrate 100. A MOS transistor including a gate electrode 106 and the mask pattern 108 is formed on the substrate 100. A gate spacer 116 surrounds the gate electrode 106 and the mask pattern 108. Source and drain regions 118 are formed adjacent the gate spacer 116. The gate electrode 106 in the peripheral region and the conductive pattern 104 in the cell region can be made from the same layer. The first and second interlayer dielectric layers 114 and 134 can be formed on the transistor. A contact plug 136 is formed through the interlayer dielectric layers 114 and 134 to contact the source and drain regions 118. A conductive line pattern 150 is formed on the contact plug 136.

Figure 5:
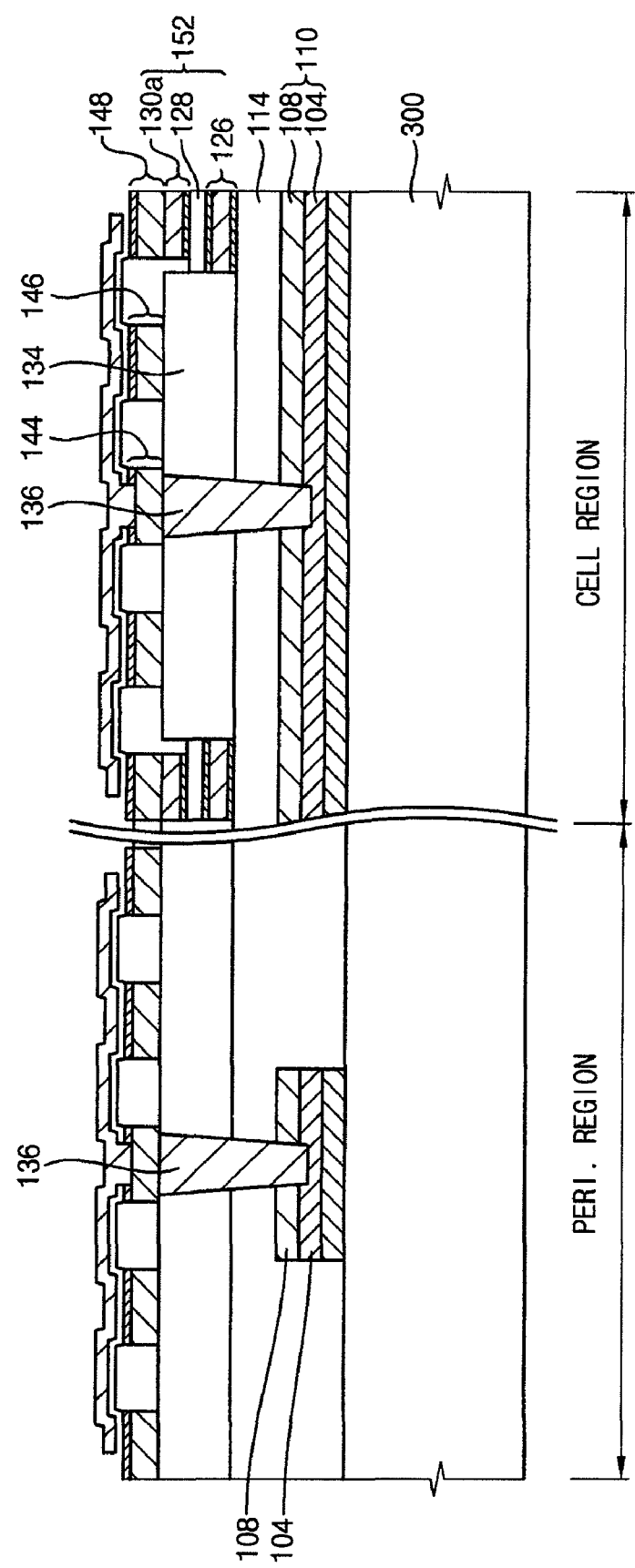
FIG. 5 is a cross-sectional view of a memory device including electromechanical switches in a peripheral region and cell region according to an exemplary embodiment of the present invention.

FIG. 5 is a cross-sectional view of a memory device including electromechanical switches in the peripheral region and the cell region according to an exemplary embodiment of the present invention.

Referring to FIG. 5, in the cell region, the electromechanical switch similar to an embodiment shown in connection with FIG. 4 is formed on a substrate 300. The substrate 300 can omit trench isolations because the substrate 300 can be a non-silicon based substrate. The substrate 300 can comprise, for example, glass or plastic. In the peripheral region, an electromechanical switch can be formed instead of the MOS transistor.

Figure 6:
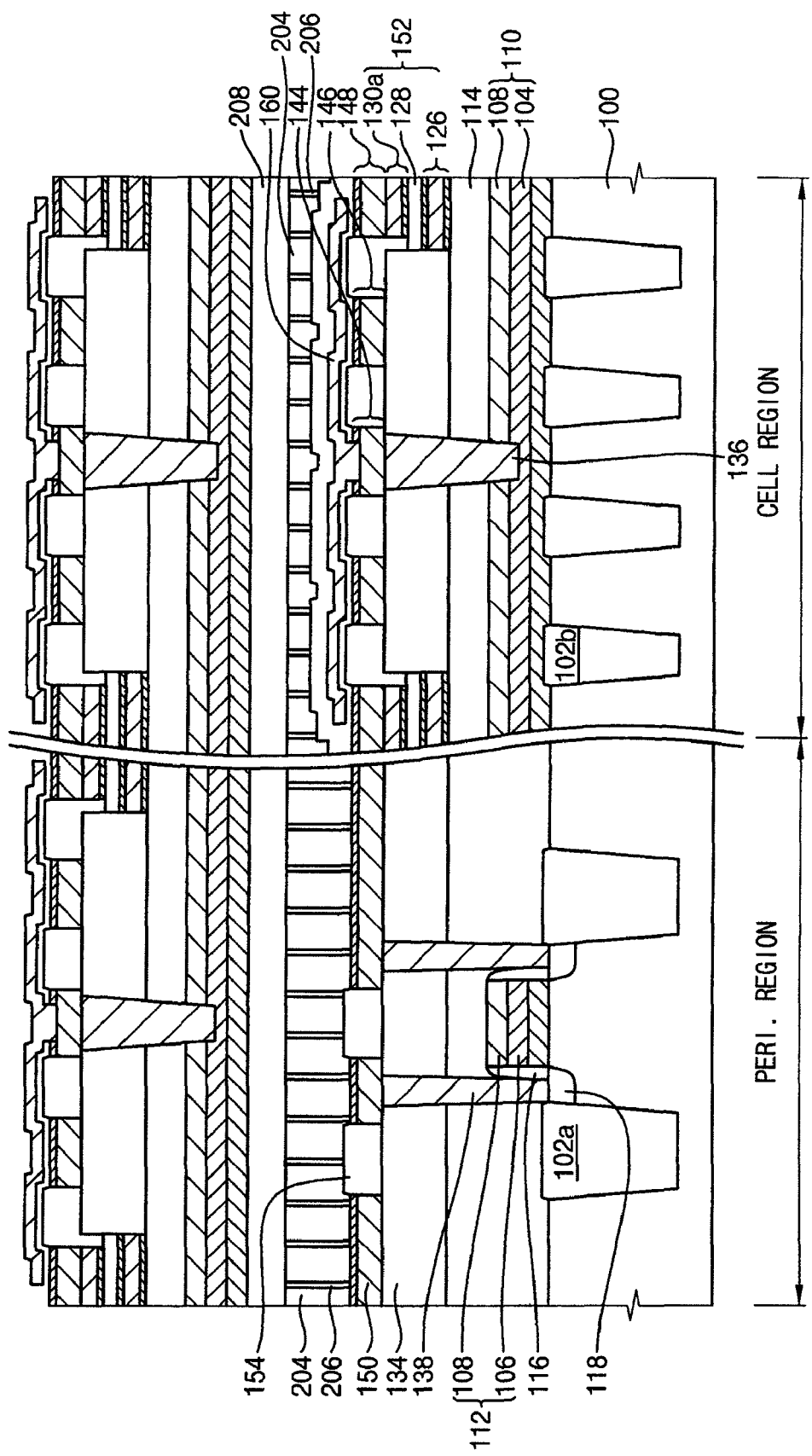
FIG. 6 is a cross-sectional view of a memory device including a first array of memory cells and a second array of memory cells formed on the first array of memory cells according to an exemplary embodiment of the present invention.

FIG. 6 is a cross-sectional view of a memory device having a stacked structure including a MOS transistor in a peripheral region according to an exemplary embodiment of the present invention.

Referring to FIG. 6, in the cell region, an interlayer dielectric layer 204 including a plurality of fine pores 206 is disposed on the suspended beam line 160. A gap exists between the suspended beam line 160 and the interlayer dielectric layer 204. In the peripheral region, the MOS transistor is formed on the substrate 100, and the interlayer dielectric layer 204 is formed on the conductive line pattern 150. A dielectric layer 208 can be formed over the interlayer dielectric layer 204 in the cell and peripheral regions. On the dielectric layer 208, another array of memory cells including an electromechanical switch is formed. As such, first and second arrays of memory cells are stacked one over another. In an exemplary embodiment, additional arrays of memory cells can be added.

Figure 7:
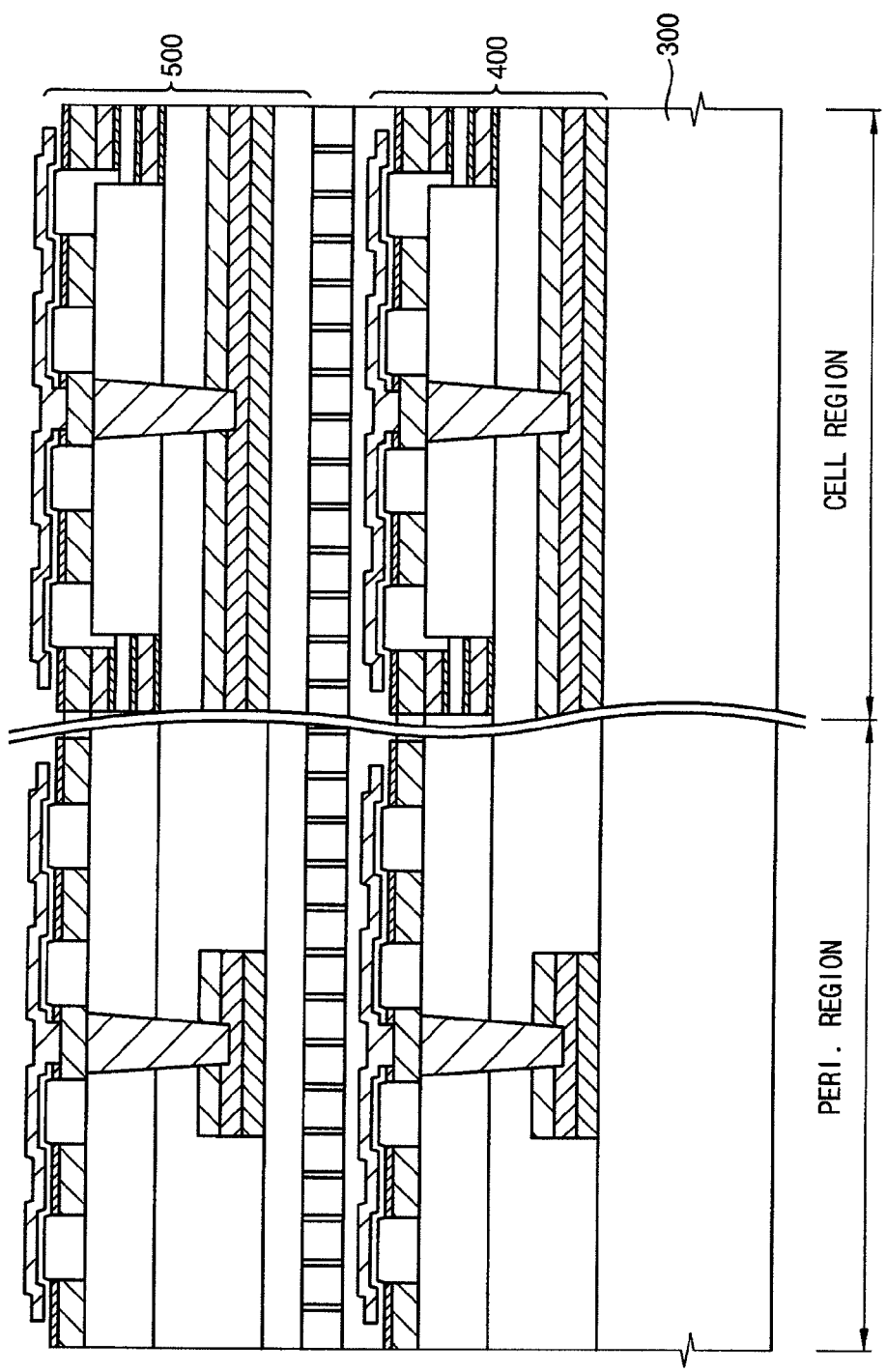
FIG. 7 is a cross-sectional view of a memory device including a first array of memory cells and a second array of memory cells formed on the first array of memory cells according to an exemplary embodiment of the present invention.

FIG. 7 is a cross-sectional view of a memory device having a stacked structure according to an exemplary embodiment of the present invention. Referring to FIG. 7, electromechanical switches are formed on the substrate 300 in a first array of memory cells 400. A second array of memory cells 500 is formed on the first array of memory cells 400. The second array of memory cells 500 also includes the electromechanical switches in the cell and peripheral regions.

Figure 8:
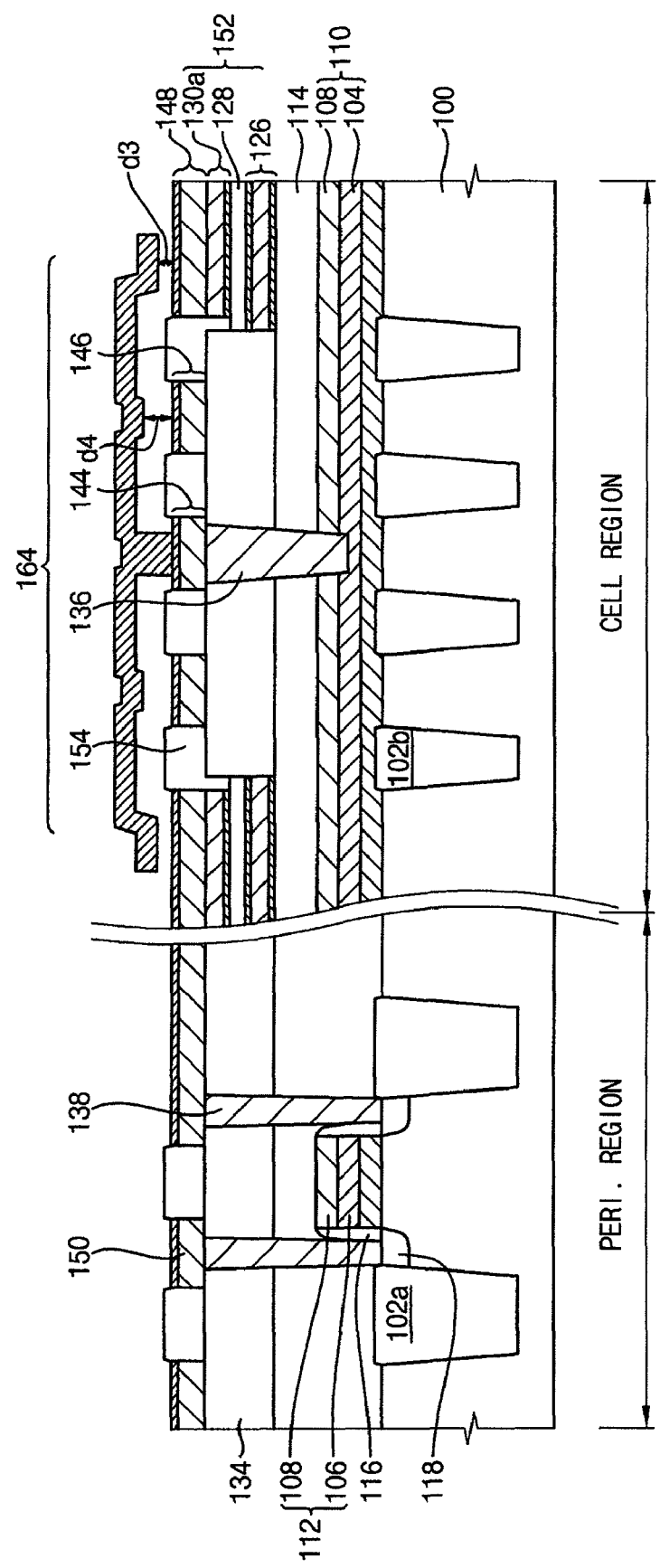
FIG. 8 is a cross-sectional view of a memory device including an electromechanical switch having a dimpled gap according to an exemplary embodiment of the present invention.

FIG. 8 is a cross-sectional view of a memory device including a MOS transistor formed in the peripheral region and the electromechanical switch formed in the cell region according to an exemplary embodiment of the present invention.

Referring to FIG. 8, the suspended beam line 164 can have a dimpled gap. That is, the first distance d3 is smaller than the second distance d4. When the dimpled gap is used in the memory device, the suspended beam line 164 can be prevented from touching the word line 146 when the word line 146 pulls the suspended beam line 164. Further, an operation voltage of the memory device can be lowered because the reduced first distance d3. In an exemplary embodiment, the suspended beam line 164 includes a plurality of recessed and protruding portions conforming to the surface formed thereunder.

Figure 9:
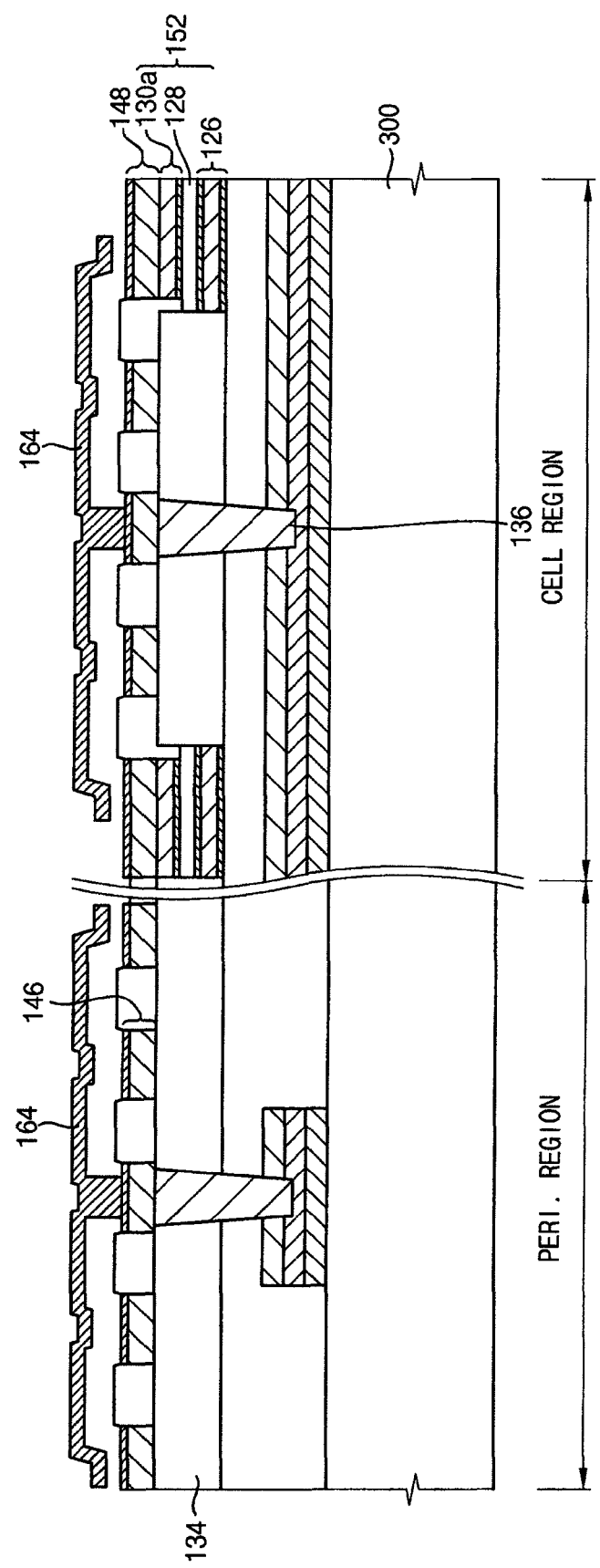
FIG. 9 a cross-sectional view of a memory device including an electromechanical switch having a dimpled gap according to an exemplary embodiment of the present invention.

FIG. 9 is a cross-sectional view of a memory device including electromechanical switches formed in the cell and peripheral regions according to an exemplary embodiment of the present invention. Referring to FIG. 9, the electromechanical switch in the cell region includes a dimpled gap between the suspended beam line 164 and the conductive pad pattern 148 formed on the capacitor 152. Alternatively, the electromechanical switch in the cell region includes a dimpled gap between the suspended beam line 164 and the capacitor 152 when the conductive pad pattern 148 is not formed on the capacitor 152. The electromechanical switch in the peripheral region includes a dimpled gap between the suspended beam line 164 and the conductive pad pattern 148 formed on the interlayer dielectric layer 134.

Figure 10:
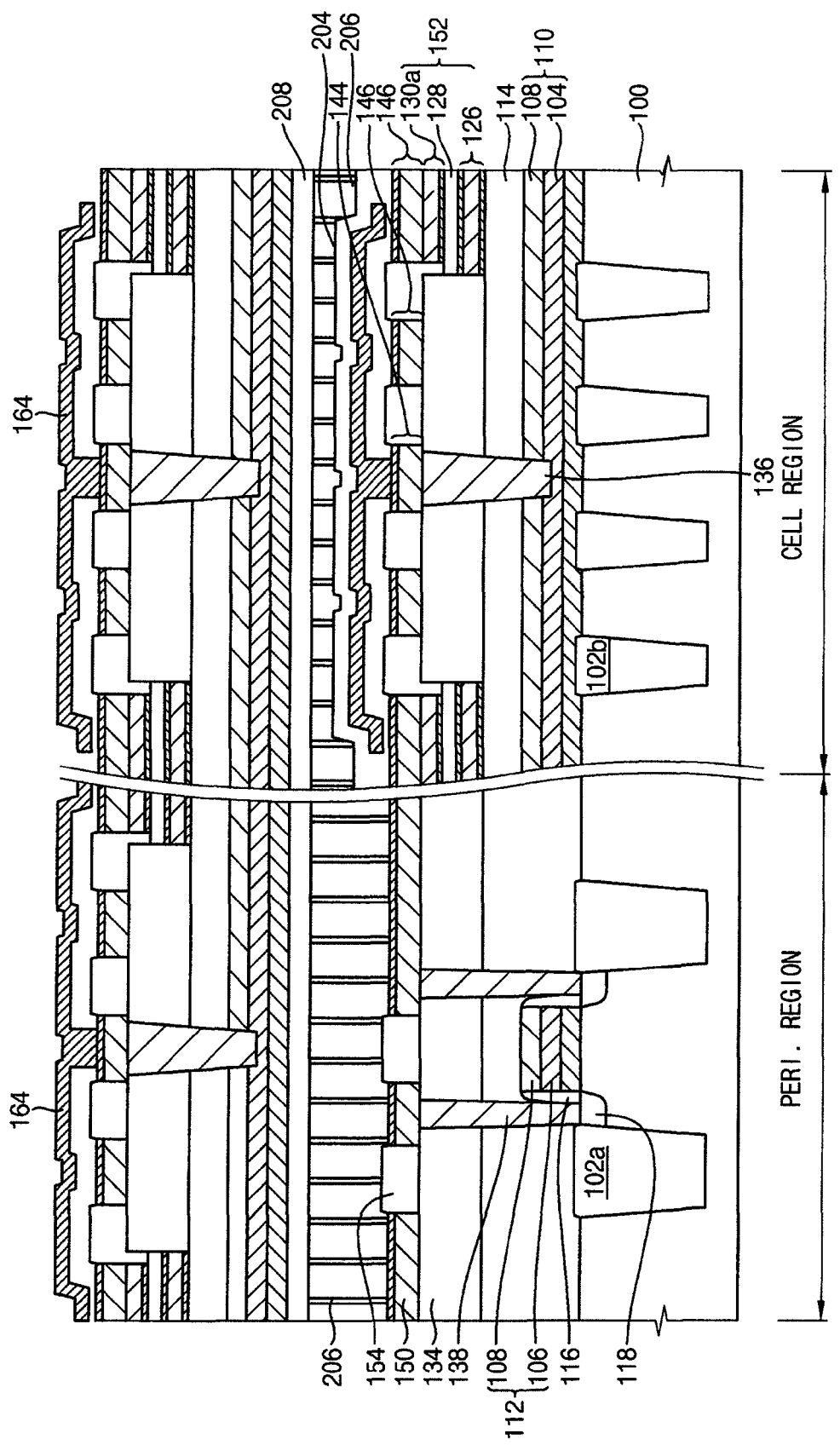
FIG. 10 is a cross-sectional view of a memory device including a first array of memory cells and a second array of memory cells formed on the first array of memory cells according to an exemplary embodiment of the present invention.

FIG. 10 is a cross-sectional view of a memory device including a MOS transistor formed in the peripheral region and an electromechanical switch formed in the cell region according to an exemplary embodiment of the present invention. Referring to FIG. 10, electromechanical switches in the first and second arrays of memory cells include a dimpled gap between the suspended beam line 164 and the conductive pad pattern 148. Alternatively, the electromechanical switches in the first and second arrays of memory cells include a dimpled gap between the suspended beam line 164 and the capacitor 152 when the capacitor 152 contacts the tip of the suspended beam line 164 directly.

FIG. 11(a) through FIG. 16(b) show a method of forming a memory device having an electromechanical switch according to an exemplary embodiment of the present invention.

Figure 11A:
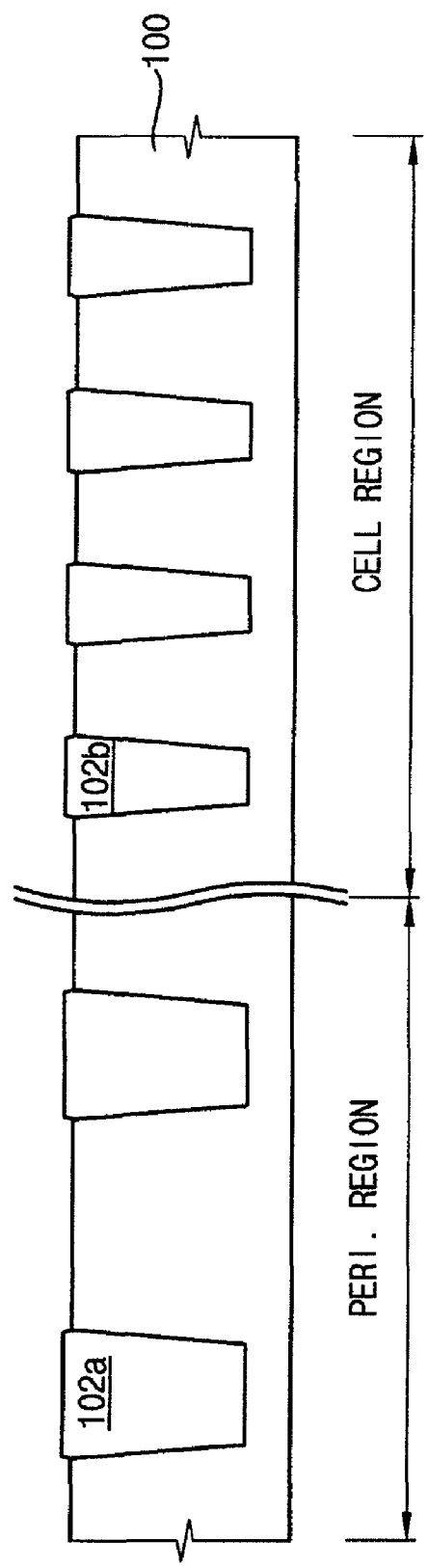
FIG. 11(a) through FIG. 16(b) show a method of forming a memory device having an electromechanical switch according to an exemplary embodiment of the present invention.

Referring to FIG. 11(a), trench isolations 102a and 102b are disposed in the substrate 100. The substrate 100 comprises, for example, silicon. The trench isolations 102a and 102b can prevent dishing problems in a subsequent chemical and mechanical polishing (CMP) process.

Figure 11B:
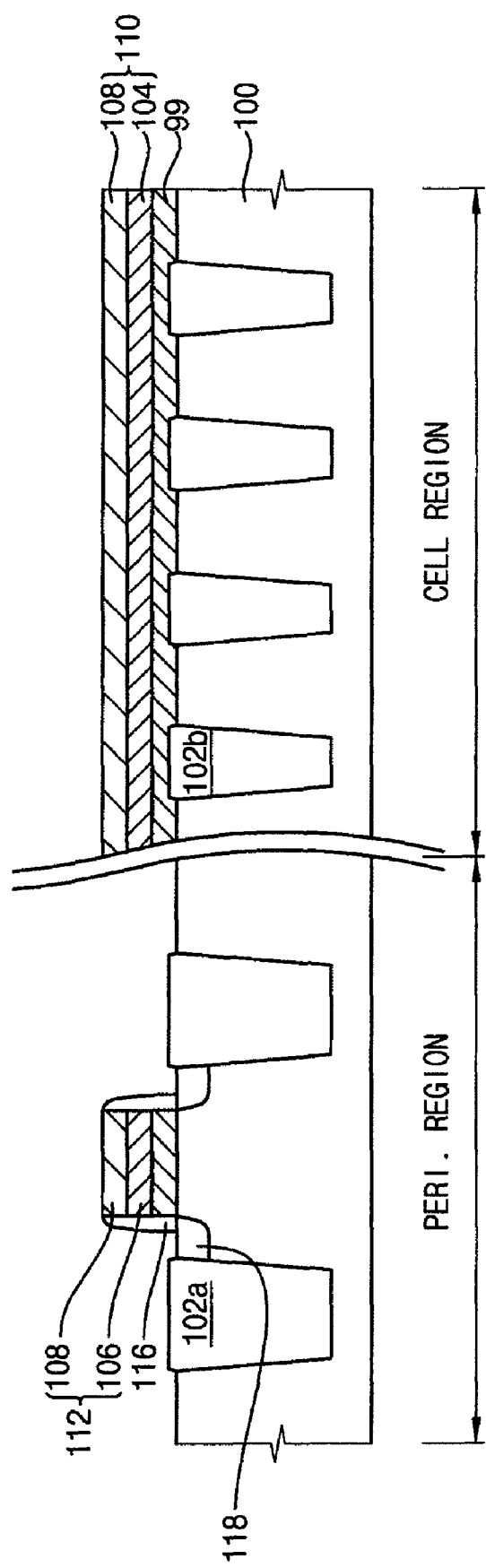

Referring to FIG. 11(b), a MOS transistor 112 is formed in the peripheral region. The buried bit line 110 including the conductive layer 104 and the mask pattern 108 is formed in the cell region. An insulating layer 99 is formed on the STI 102a and the substrate 100. The conductive layer 104 and the mask layer 108 are formed on the insulating layer 99. The conductive layer 104 can comprise material having a low resistivity. The material can be, for example, metal, metal silicide or doped semiconductor. The transistor 112 in the peripheral region can be formed by patterning the conductive layer 104 and the mask layer 108. As such, the gate electrode 106 is formed in the transistor 112. A gate spacer 116 surrounds the transistor 112. A source and drain region 118 is formed in the substrate 100.

Figure 12A:
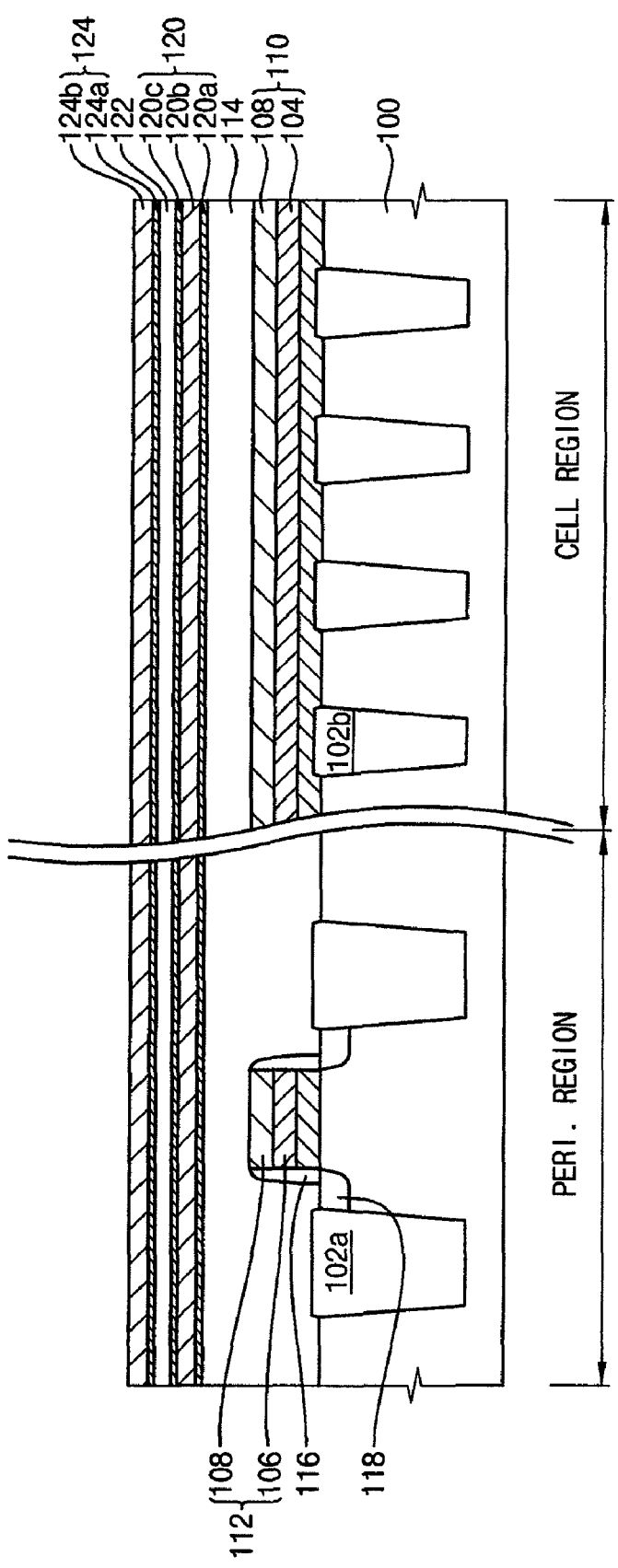
Figure 12B:
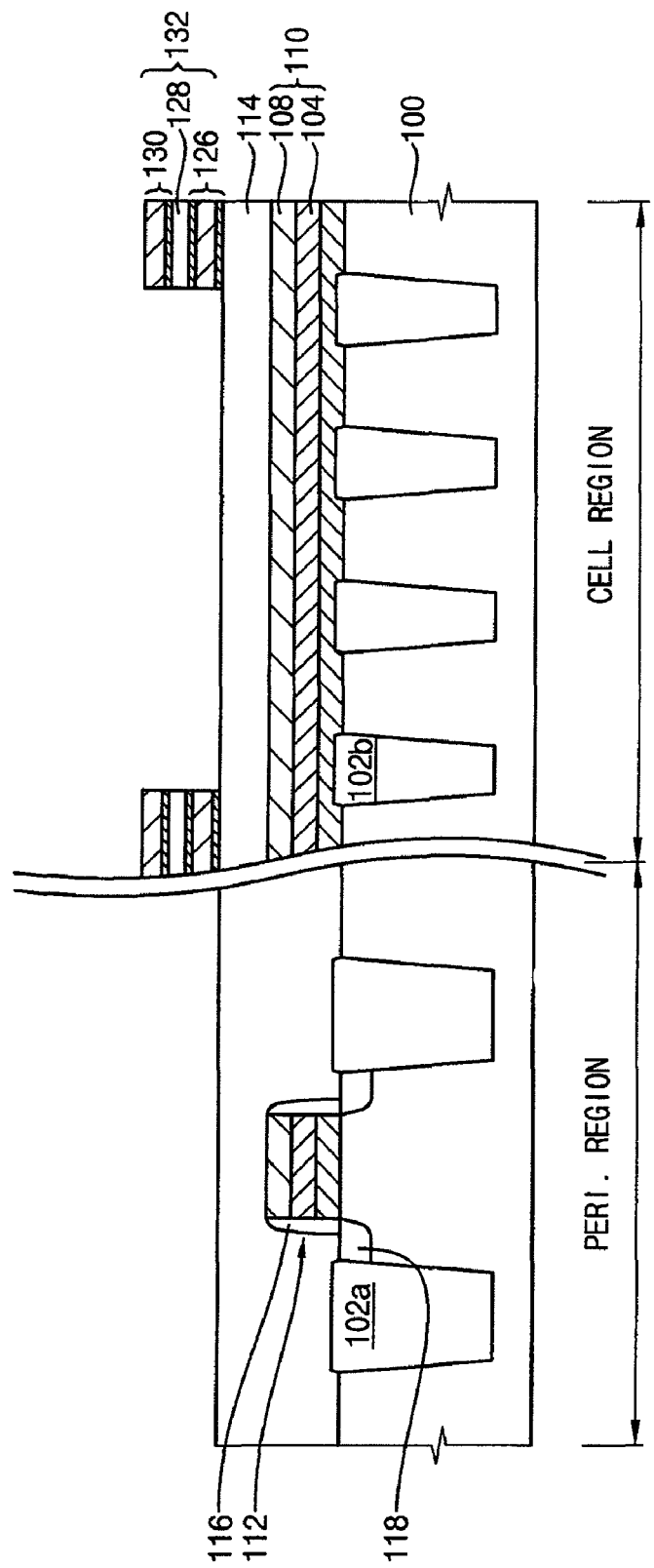

Referring to FIG. 12(a), the first interlayer insulating layer 114 is formed on the mask pattern 108 of the buried bit line 110 and the transistor 112. A first electrode 120 is formed on the first interlayer insulating layer 114. A dielectric layer 122 is formed on the first electrode 120. A second electrode 124 is formed on the dielectric layer 122. The first electrode 120 can be a multilayer structure. The first electrode can include a barrier metal layer 120a, a metal layer 120b, a capping layer 120c. The barrier metal layer 120a may comprise, for example, titanium or titanium nitride. The metal layer 120b may comprise, for example, tungsten. The capping layer 120c may comprise, for example, titanium nitride. In an exemplary embodiment, the dielectric layer 122 can comprise, for example, oxide-nitride-oxide (ONO), or at least one of aluminum oxide, zirconium oxide, Hafnium oxide, Tantalum oxide, or a mixture thereof. The second electrode 124 can also comprise a multilayer structure. The second electrode 124 can include a barrier layer 124a and a metal layer 124b. The barrier layer 124a can comprise, for example, titanium nitride. The metal layer 124b can comprise, for example, tungsten. Referring to FIG. 12(b), the first electrode 120, the interlayer insulating layer 114, and the second electrode 124 are etched to form a preliminary capacitor 132.

Figure 13A:
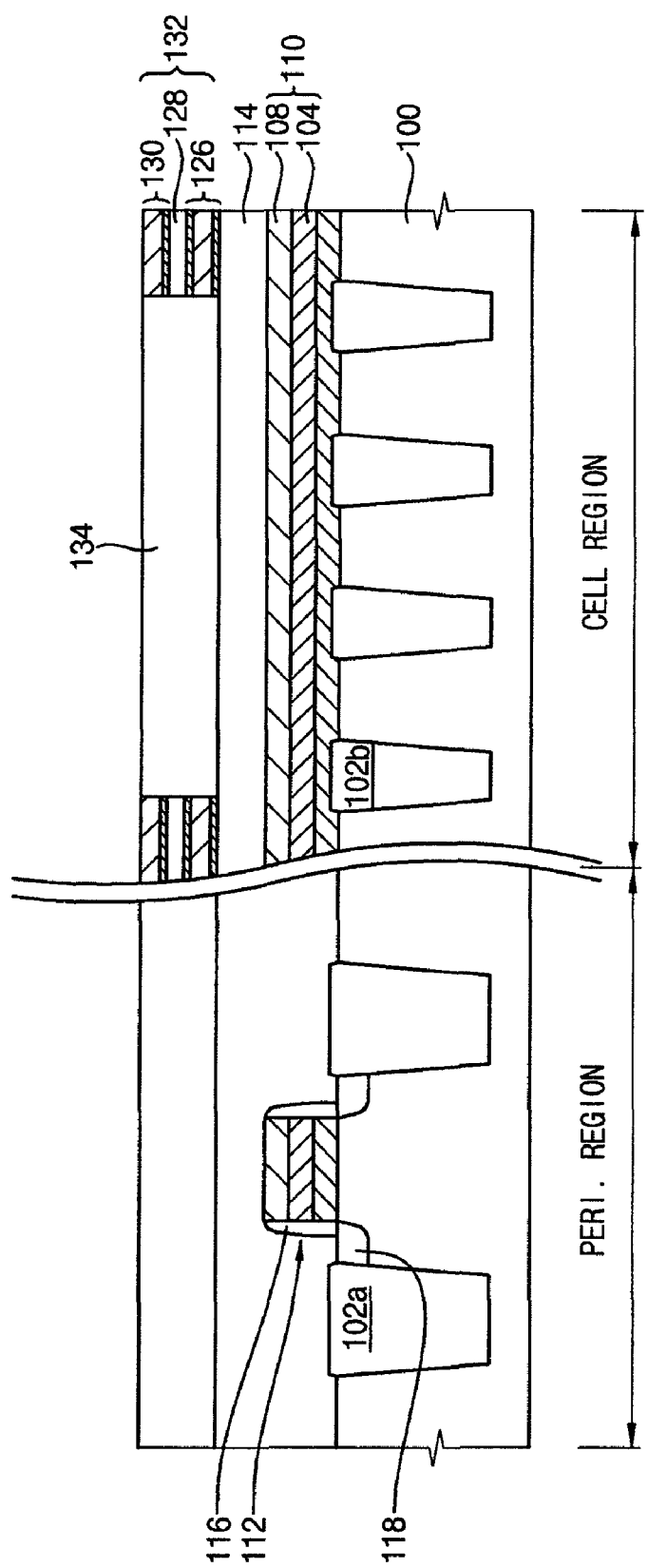
Figure 13B:
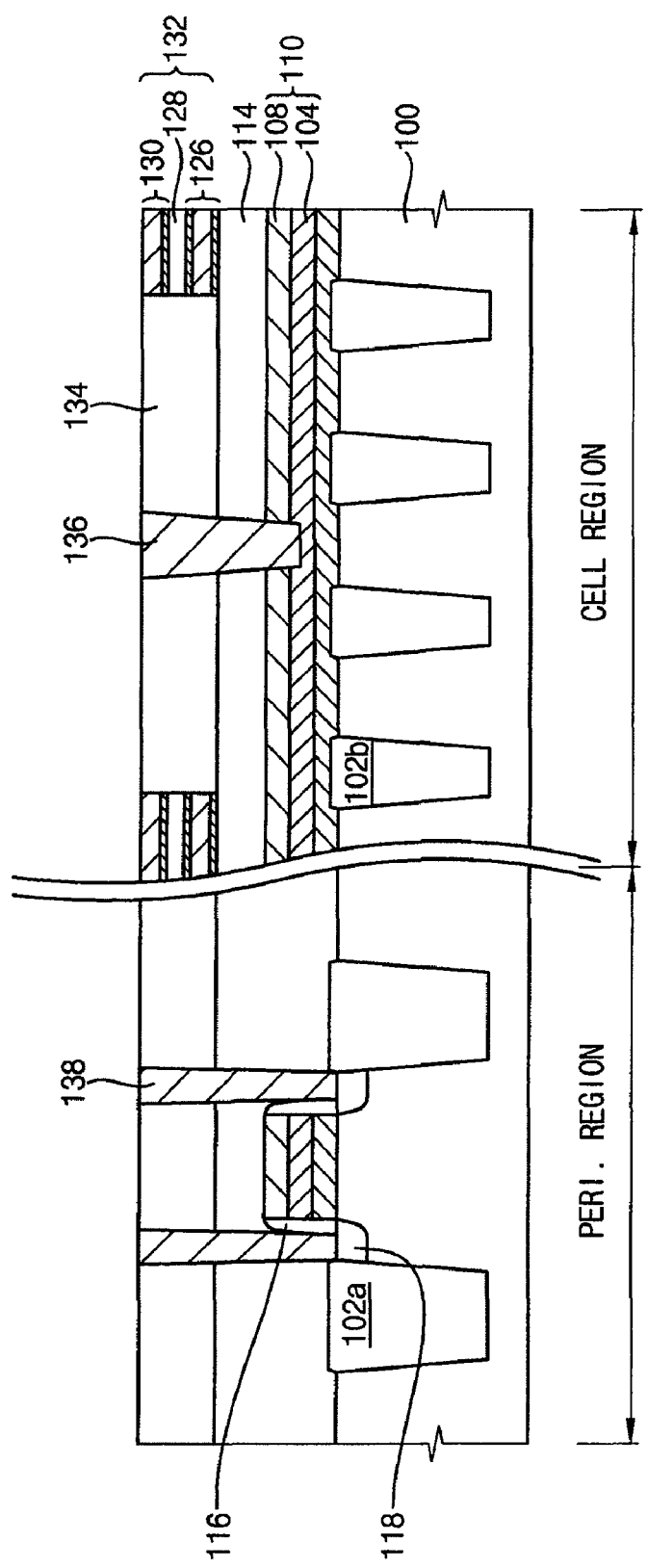

Referring to FIGS. 13(a) and 13(b), the second interlayer dielectric layer 134 is formed on the first interlayer dielectric layer 114. The first contact plug 136 is formed through the interlayer dielectric layers 134, 114. The first contact plug 136 contacts the buried bit line 110. In the peripheral region, a second contact plug 138 is formed through the interlayer dielectric layers 134, 114. The second contact plug 138 contacts the source/drain region 118. The contact plugs 136, 138 may comprise, for example, Ti, TiN, W, Al or Cu.

Figure 14A:
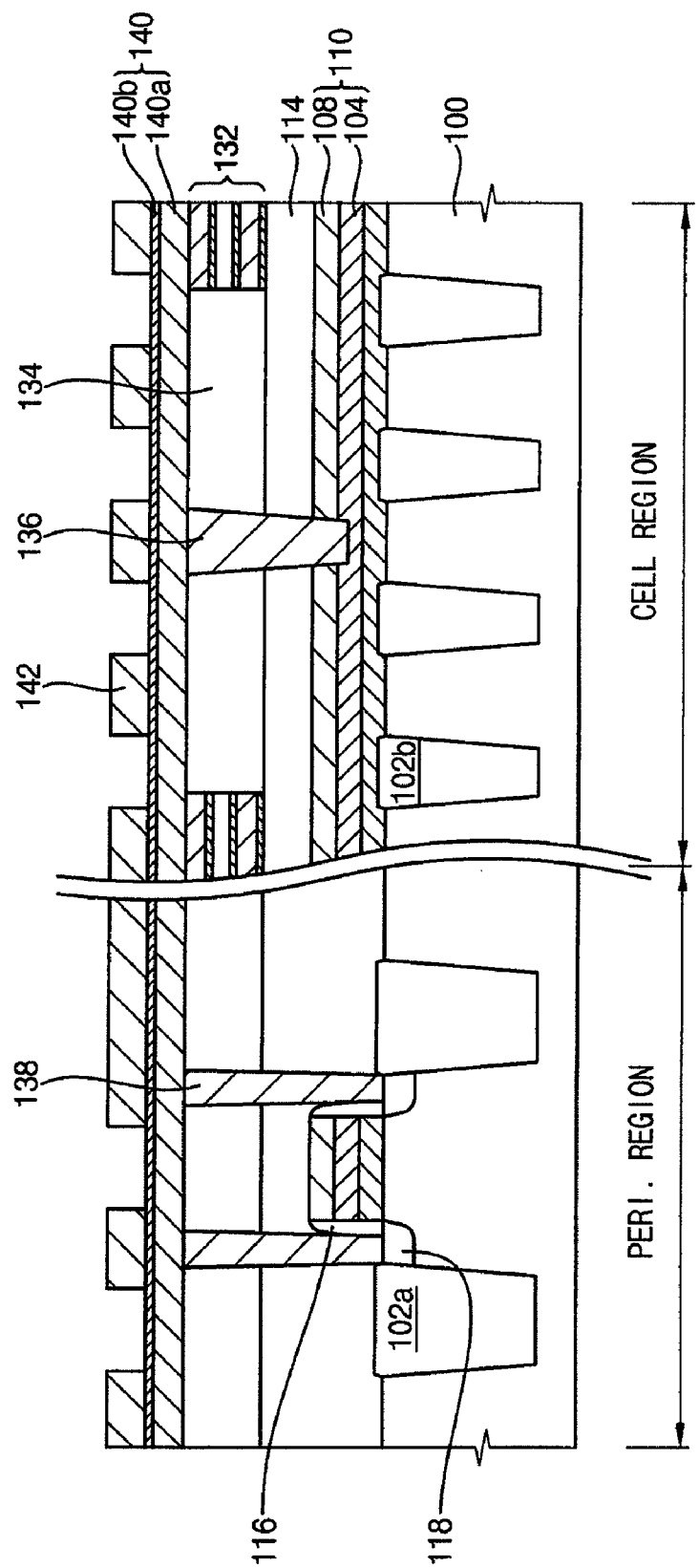
Figure 14B:
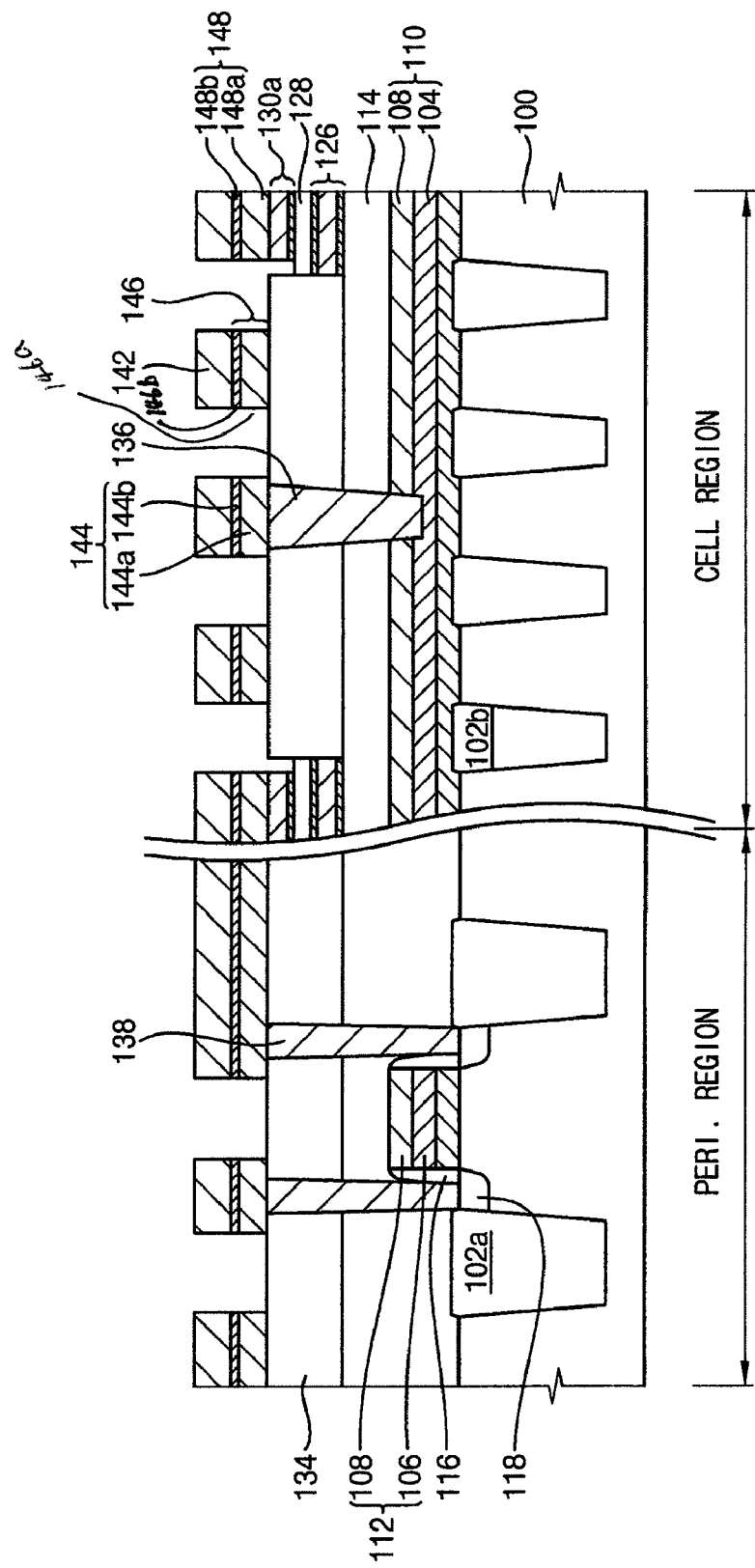

Referring to FIGS. 14(a) and 14(b), the word line 146 and the conductive pad pattern 144, 148 are formed. A conductive layer 140a is formed on the preliminary capacitor 132, the contact plugs 136, 138, and the second interlayer insulating layer 134. A capping layer 140b is formed on the conductive layer 140a, thereby constituting a conductive pattern 140. The capping layer 140b can enhance the contact characteristics between capacitors and beam lines. A mask pattern 142 is formed on the capping layer 140b. The capping layer 140b and the conductive layer 140a are etched using the mask pattern 142.

Figure 15A:
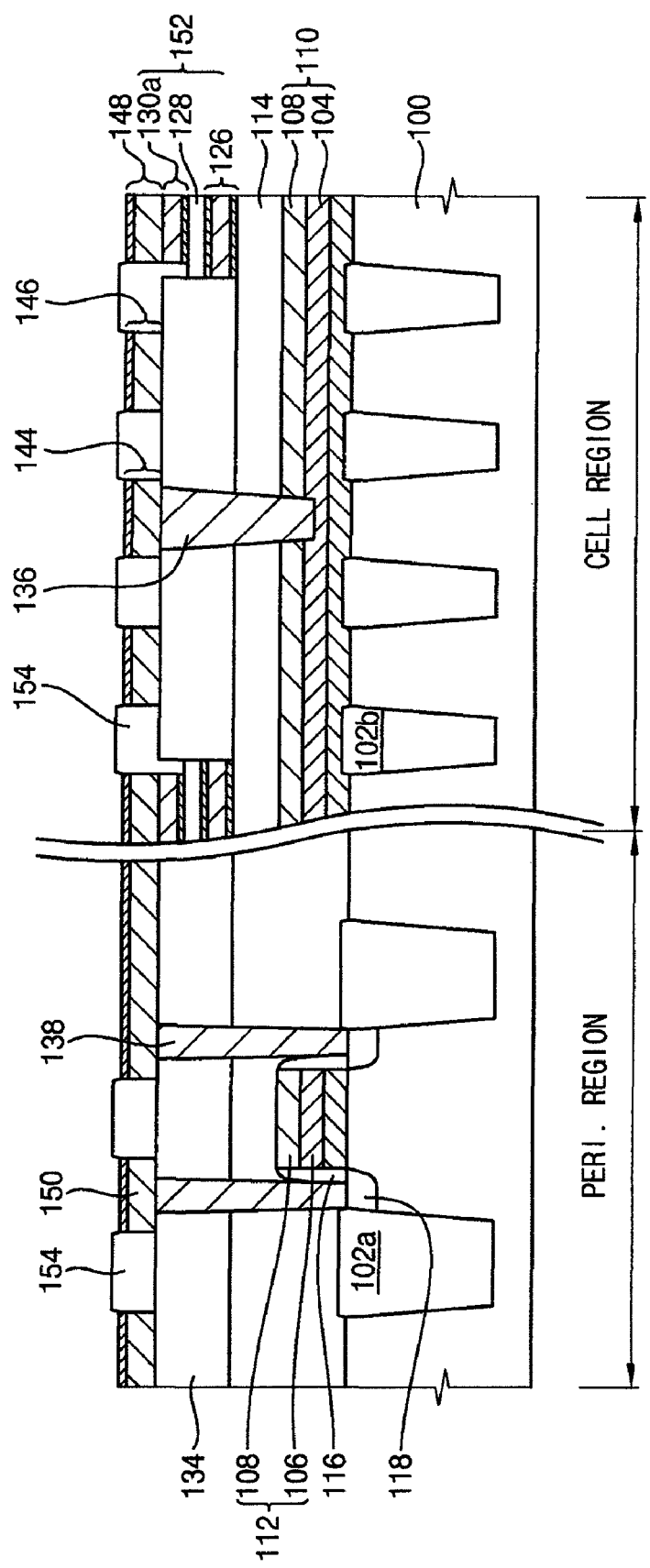
Figure 15B:
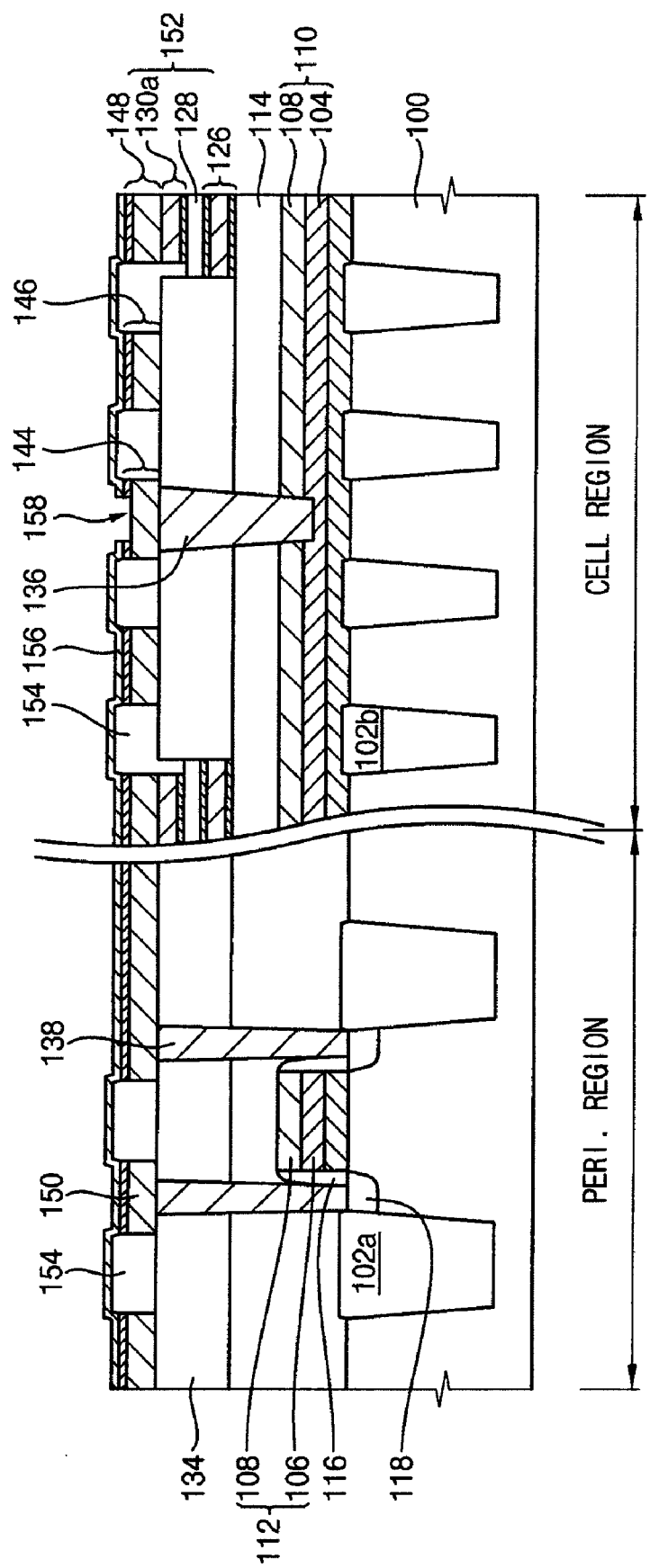
Figure 16A:
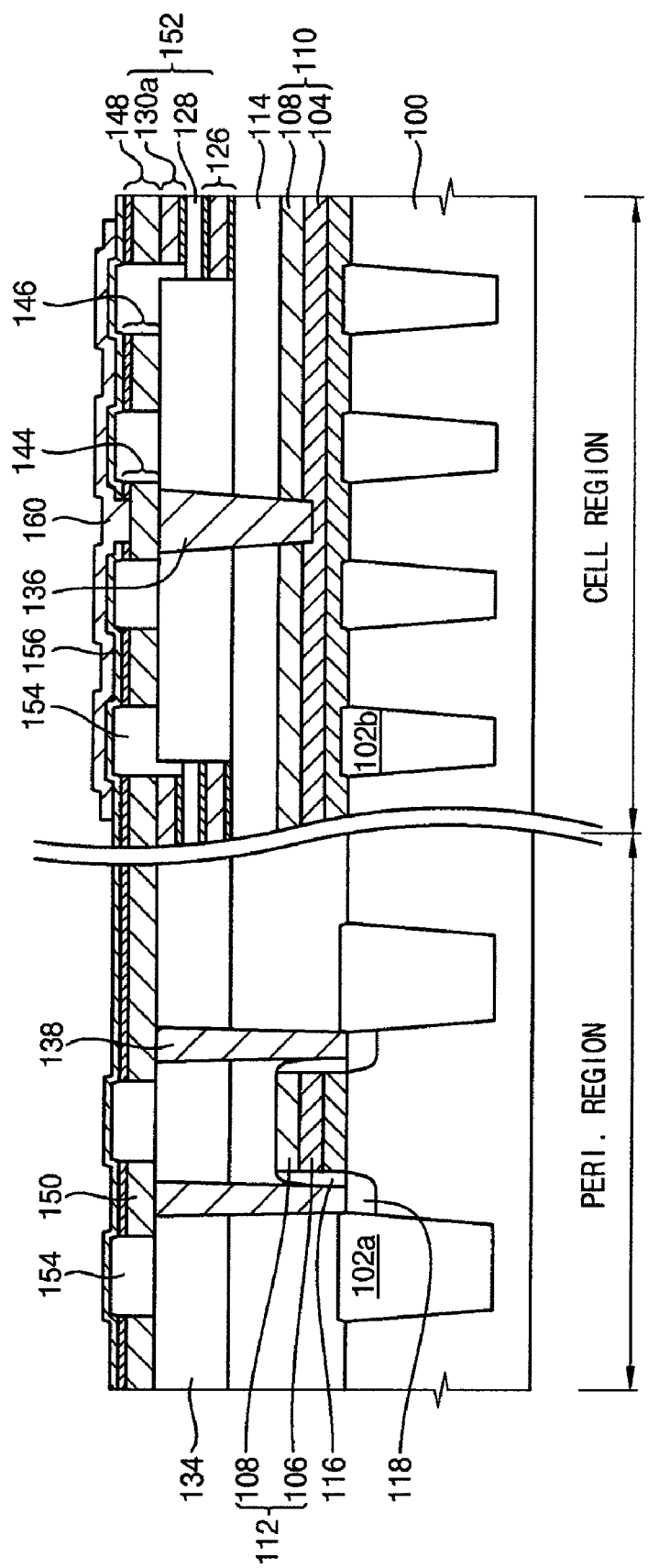
Figure 16B:
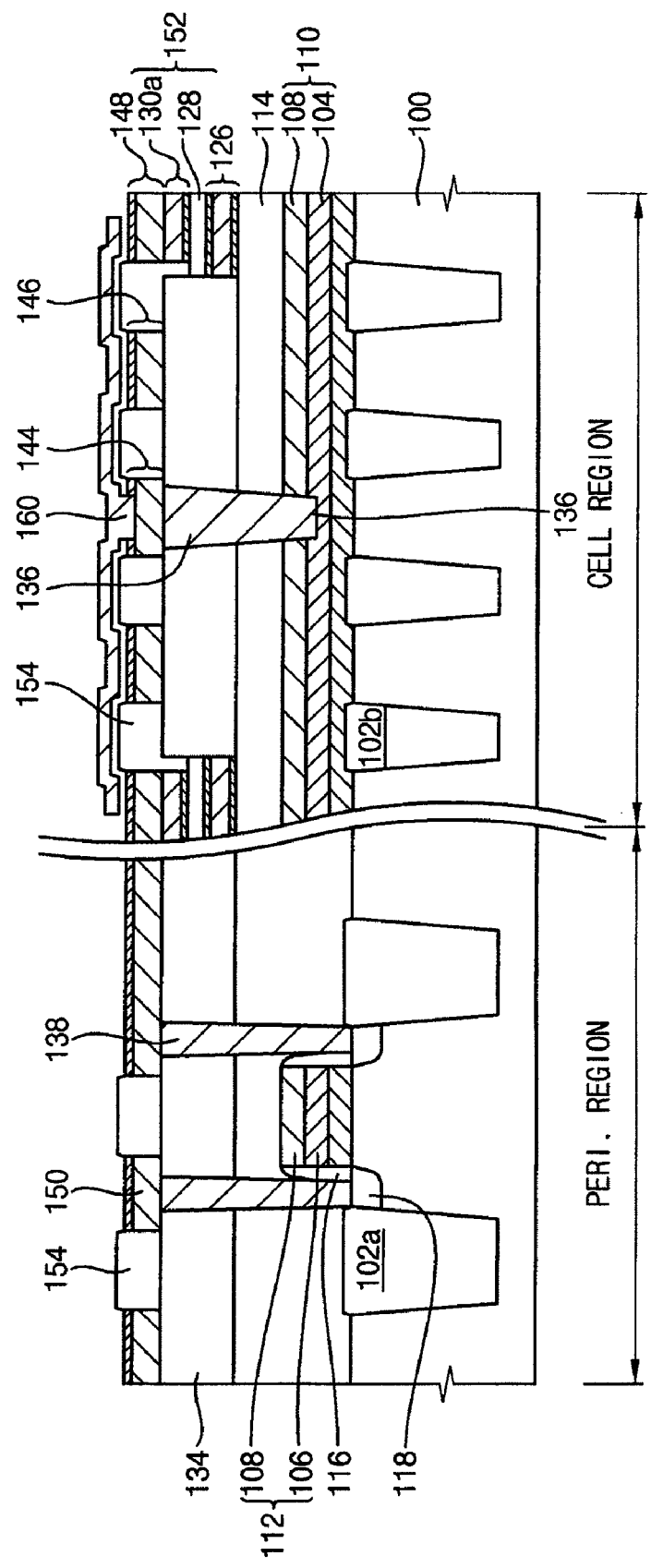

Referring to FIGS. 15(a), 15(b) and 16(a), a sacrificial layer 156 having an opening 158 exposing a top surface of the conductive pad pattern 144 is formed. The sacrificial layer 156 is formed on the conductive pad pattern 144, 148 and the interlayer dielectric layer 154. The sacrificial layer 156 can have a different etch selectivity from the interlayer dielectric layer 154 and material comprising the suspended beam line 160 formed over the sacrificial layer 154 in a subsequent process. For example, polysilicon, atomic layer deposition (ALD) oxide, SiGe, SiN, doped silicon, or doped silicon oxide can be used as the sacrificial layer 156. A second distance between the suspended beam line 160 and the word line 146 and a first distance between the suspended beam line 160 and the conductive pad pattern 148 formed on the capacitor 152 can be controlled by the thickness of the sacrificial layer 156. This is because the first distance and the second distance correspond to the thickness of the sacrificial layer 156 which is removed in a subsequent process. In an exemplary embodiment, the sacrificial layer 156 has a substantially same thickness throughout the entire cell region. As such, the first and second distances can be the same.

Referring to FIGS. 16 (a) and 16(b), the suspended beam line 160 having a high elasticity and dynamic stability is formed on the sacrificial layer 156. The suspended beam line 160 can be a single layer structure comprising, for example, Ti, TiN, a Ti metal alloy, Ta, TaN, a Ta metal alloy, or cabon nano tube. In an exemplary embodiment, the suspended beam line 160 can be a two layer structure where a first layer is laminated on a second layer. For example, the first layer may comprise $SiO_2$ or SiN, and the second layer may comprise a conductive material such as Ti, TiN, a Ti metal alloy, Ta, TaN, a Ta metal alloy, or cabon nano tube. In an exemplary embodiment, the suspended beam line 160 can be a multilayer structure. For example, in a three layer structure, the first layer may comprise $SiO_2$, the second layer may comprise TiN, and the third layer may comprise TaN. The suspend beam line 160 can be anchored on the conductive pad pattern 144 formed on the contact plug 136. In an exemplary embodiment, the beam line pattern 160 can be adhered to the conductive pad pattern 144 without using an adhesive because the adhesion occurs when the suspended beam line 160 is deposited on the conductive pad pattern 144. The sacrificial layer 156 can be removed by, for example, a wet etch process, a critical point dryer (CPD), or a plasma chemical dry etching.

FIG. 17(a) through FIG. 20 show a method of forming a second array of memory cells formed on a first array of memory cells according to an exemplary embodiment of the present invention. In an exemplary embodiment, multiple layers of memory cells can be stacked one over another. For the first array of memory cells, an exemplary embodiment described in connection with FIG. 11(a) through FIG. 16(b) can be used.

Figure 17A:
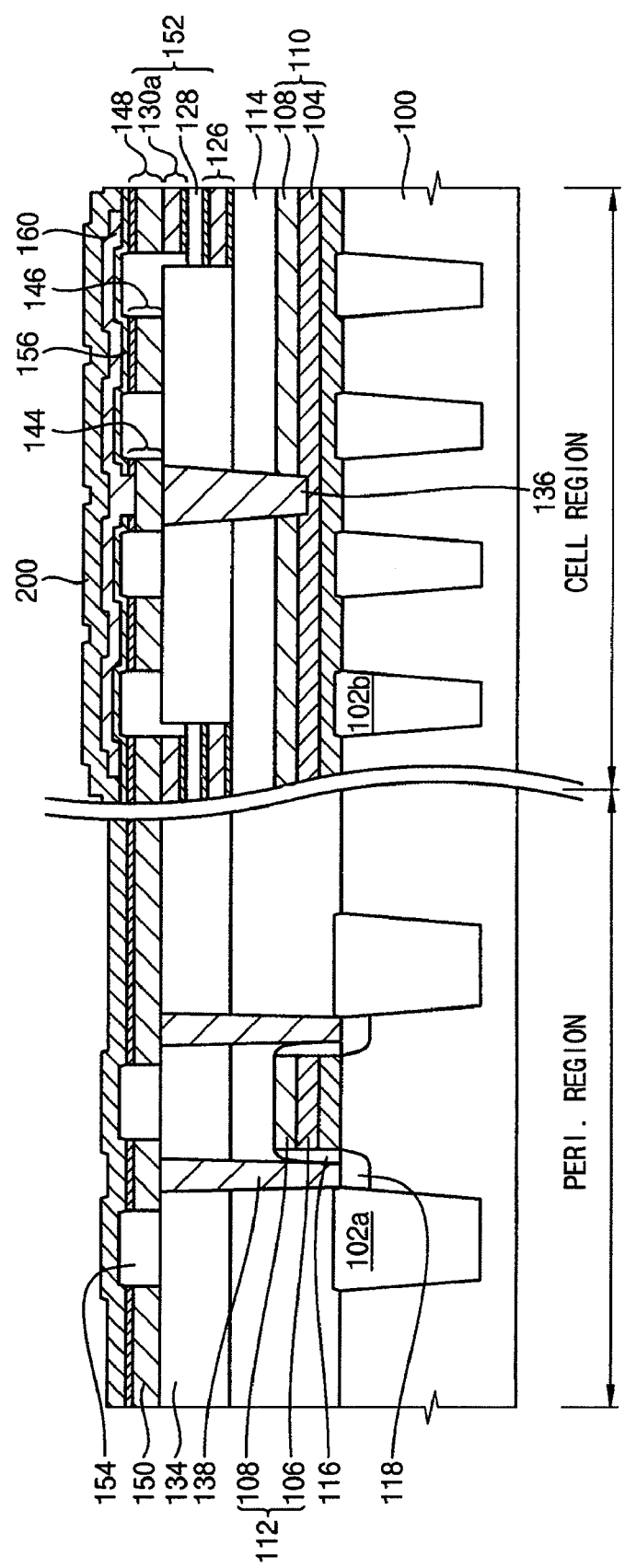
FIG. 17(a) through FIG. 20 show a method of forming a second array of memory cells formed on a first array of memory cells according to an exemplary embodiment of the present invention.
Figure 17B:
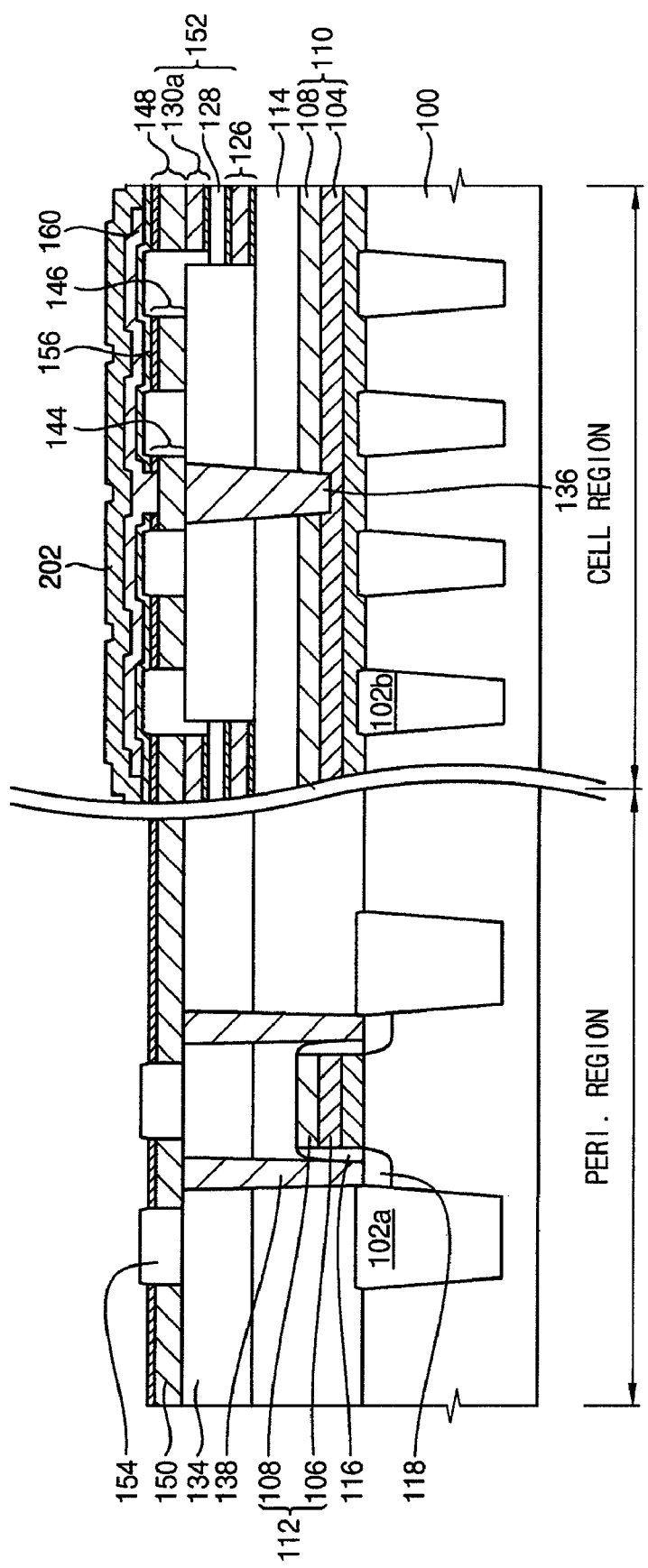

Referring to FIGS. 17(a) and 17(b), an additional sacrificial layer 200 is disposed over the suspended beam line 160. The additional sacrificial layer 200 is formed in the peripheral region and the cell region. The additional sacrificial layer 200 formed in the peripheral region is removed. In an exemplary embodiment, the additional sacrificial layer 200 comprises the same material with the sacrificial layer 156. When both of the sacrificial layers 200 and 156 are removed in a subsequent process, a space is formed around the suspended beam line 160. The space allows the suspended beam line 160 moves upwardly or downwardly. The space can be a vacuum state or filled with an inert gas such as, for example, N2.

Figure 18A:
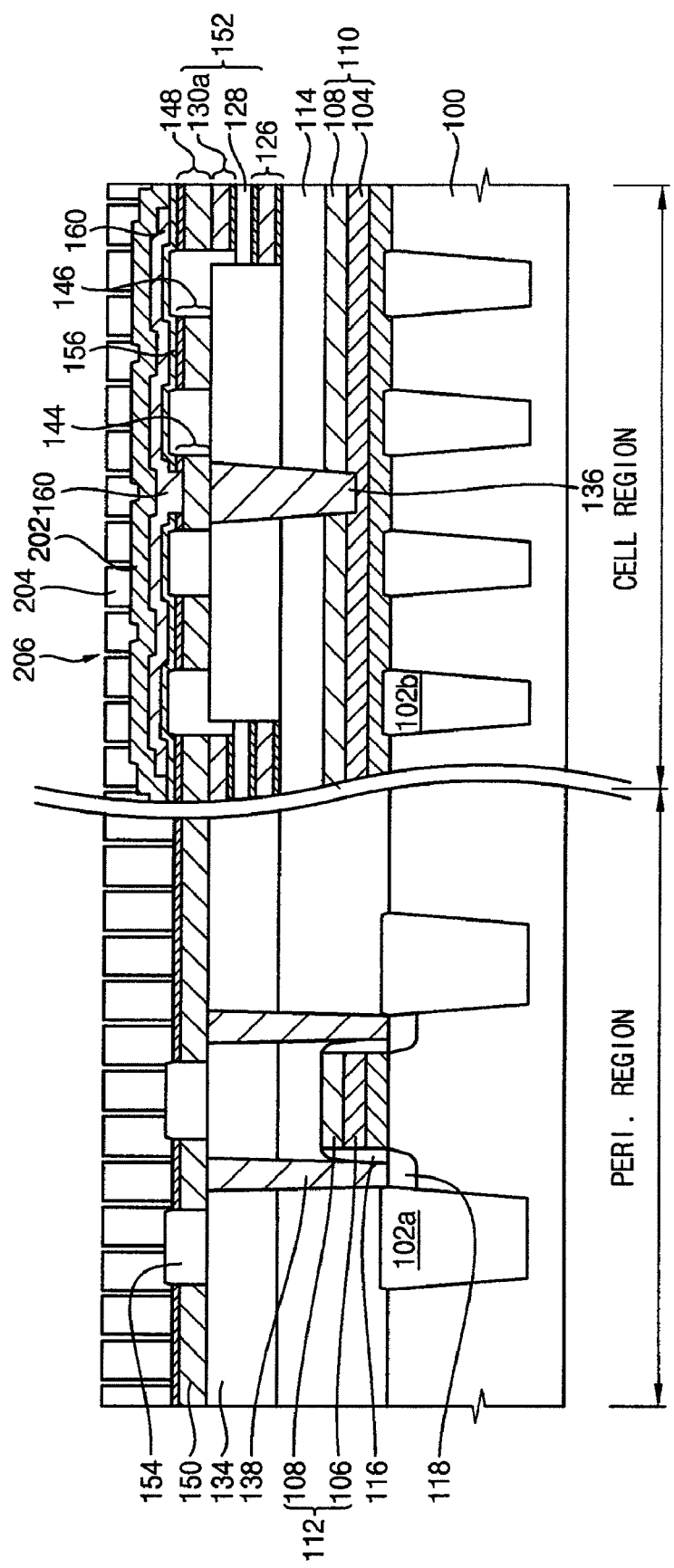
Figure 18B:
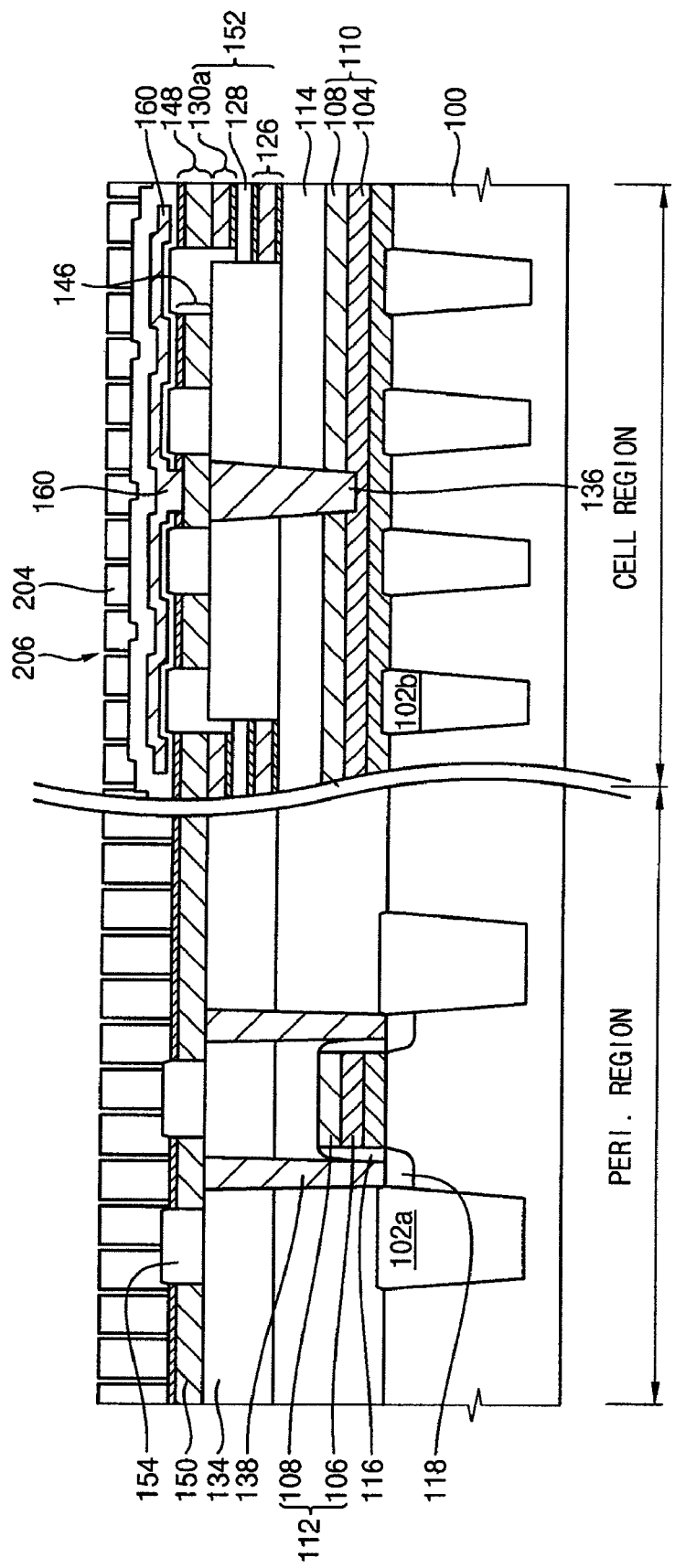

Referring to FIGS. 18(a) and 18(b), the dielectric layer 204 is formed on the additional sacrificial layer 202. The dielectric layer 204 has a plurality of fine pores 206. The fine pores 206 can be used as paths transmitting gases or liquids used in removing the sacrificial layers 156, 202. The removed sacrificial layers 156, 202 can also be transmitted through the pores 206. For example, when the sacrificial layers 156, 202 are removed by a wet etch process, etching chemicals can be transmitted through the fine pores 206. Each fine pore 206 may have a diameter of about 10 nm to about 20 nm. In an exemplary embodiment, the fine pores 206 may be formed in a regular pattern. In an exemplary embodiment, the fire pores 206 can be formed in the dielectric layer 204 after the dielectric layer 204 is formed on the additional sacrificial layer 202. The dielectric layer 204 may comprise, for example, polystyrene or polymethylmethacrylate (PMMA).

Figure 19:
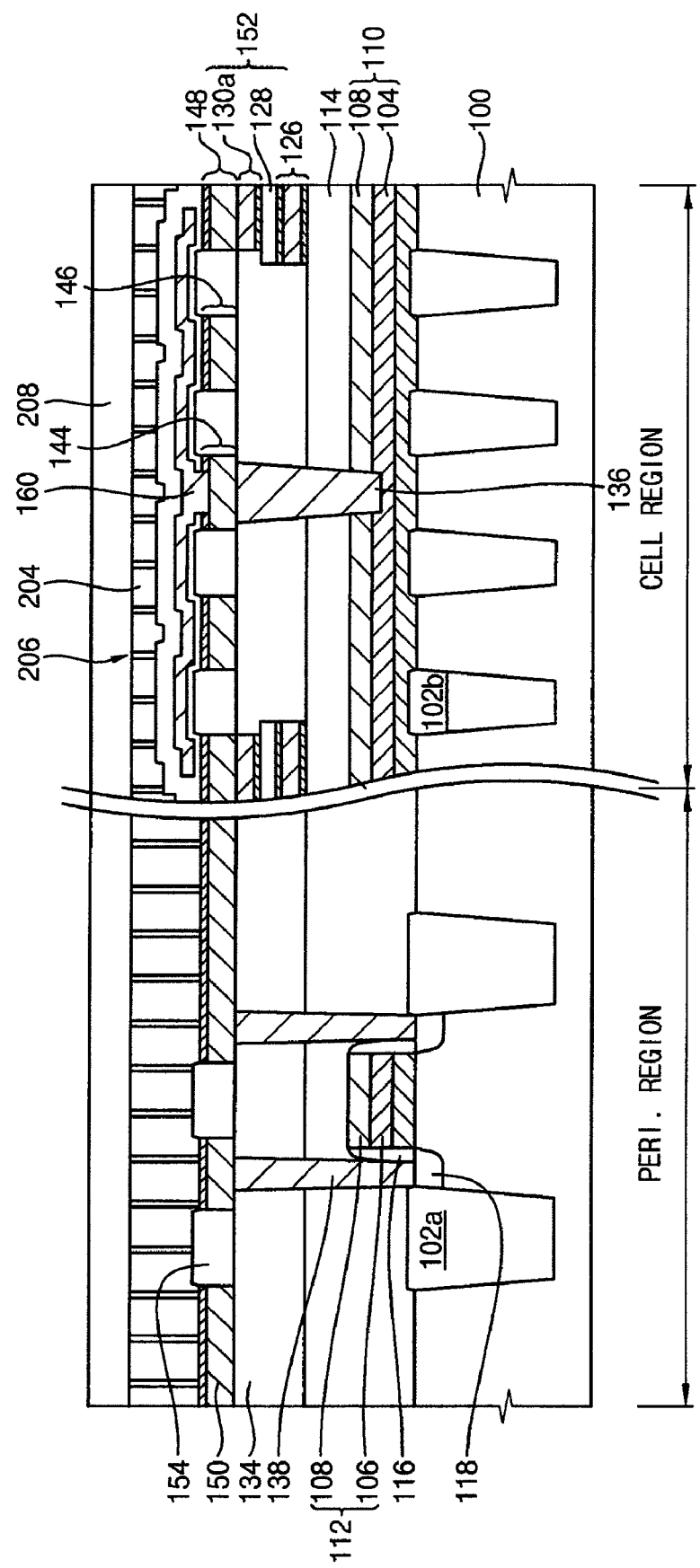
Figure 20:
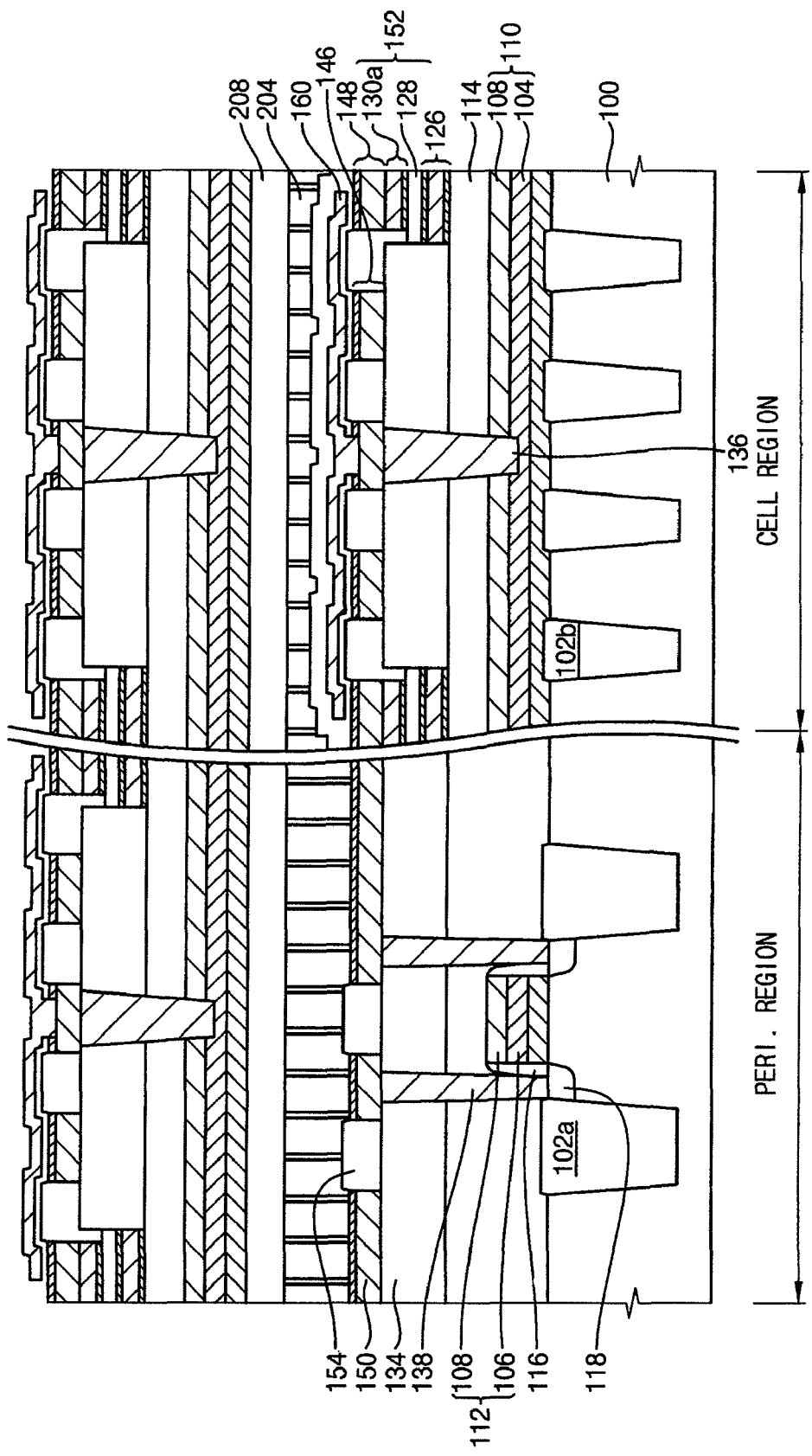

Referring to FIG. 19 and FIG. 20, a dielectric layer 208 is formed on the dielectric layer 204 having the plurality of fine pores 206. An upper array of memory cells can be formed on the dielectric layer (208). The substrate 100 required in the lower array of memory cells can be omitted when forming the upper array of memory cells because electromechanical switches of exemplary embodiments of the present invention can be formed directly on a dielectric layer.

Figure 21A:
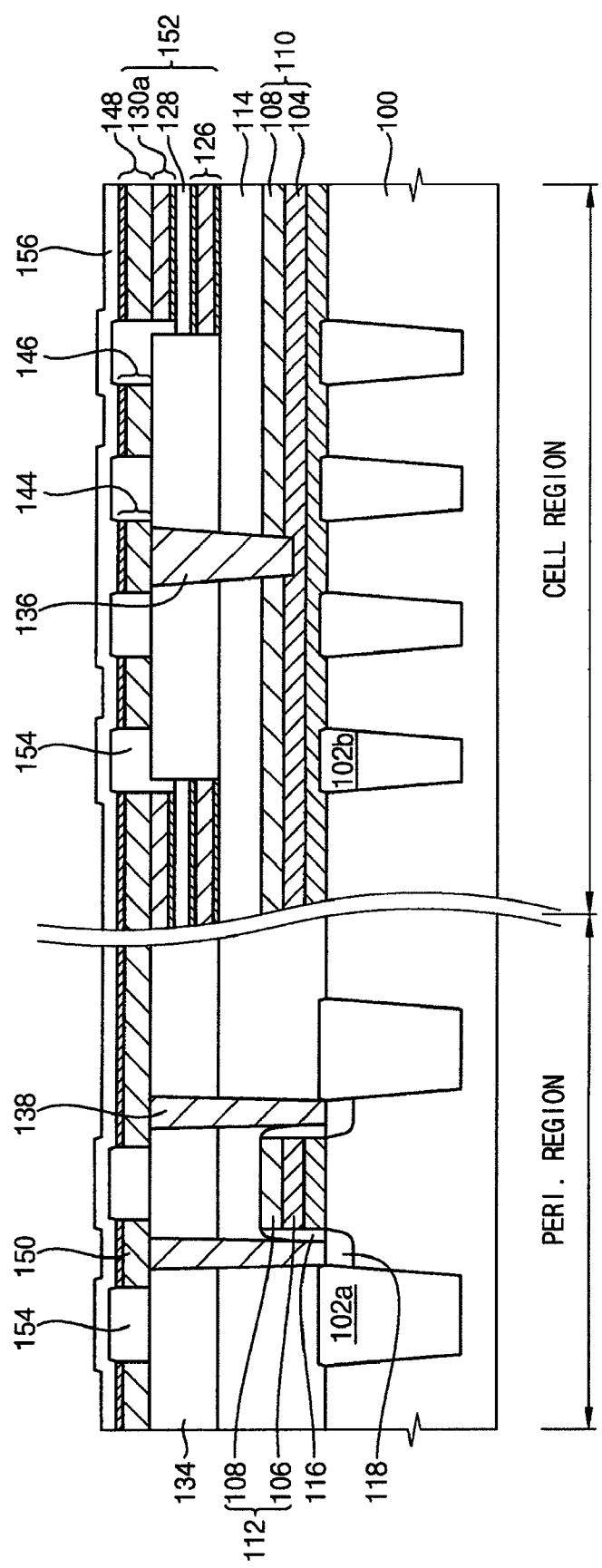
FIG. 21(a) through FIG. 23(b) show a method of forming an electromechanical switch having the dimpled gap according to an exemplary embodiment of the present invention.
Figure 21B:
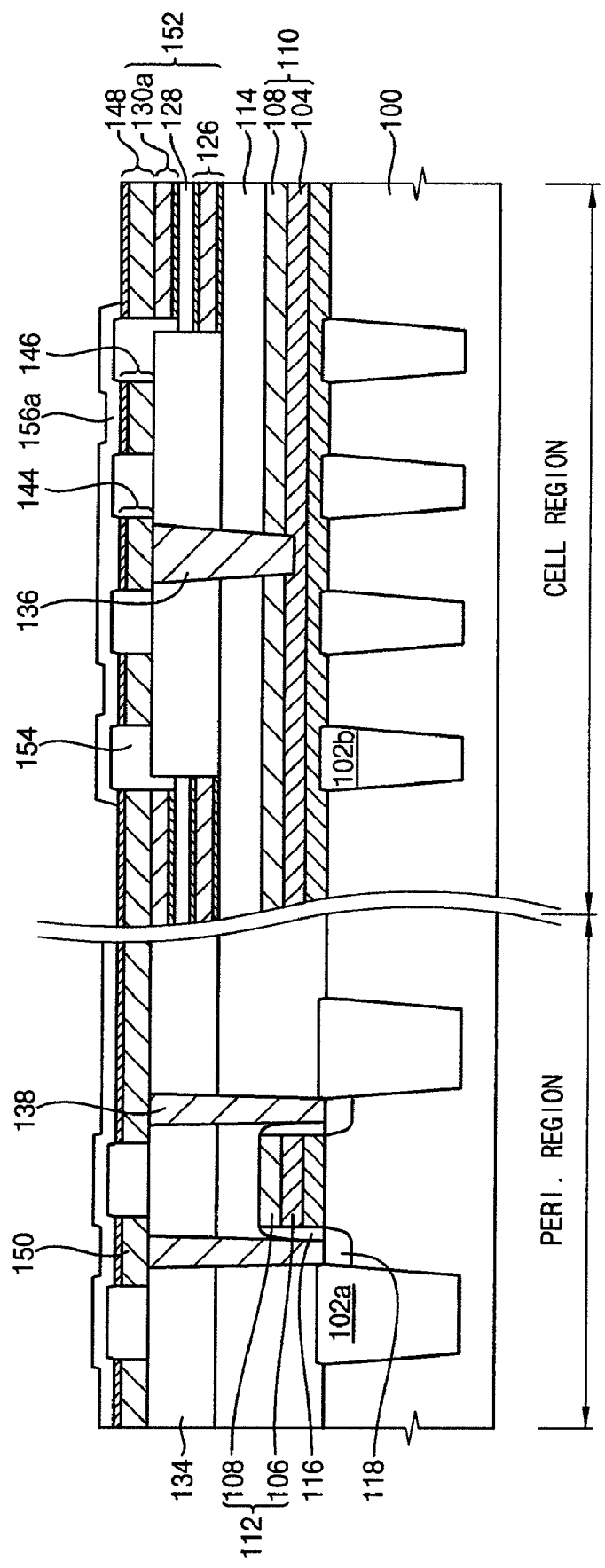
Figure 23A:
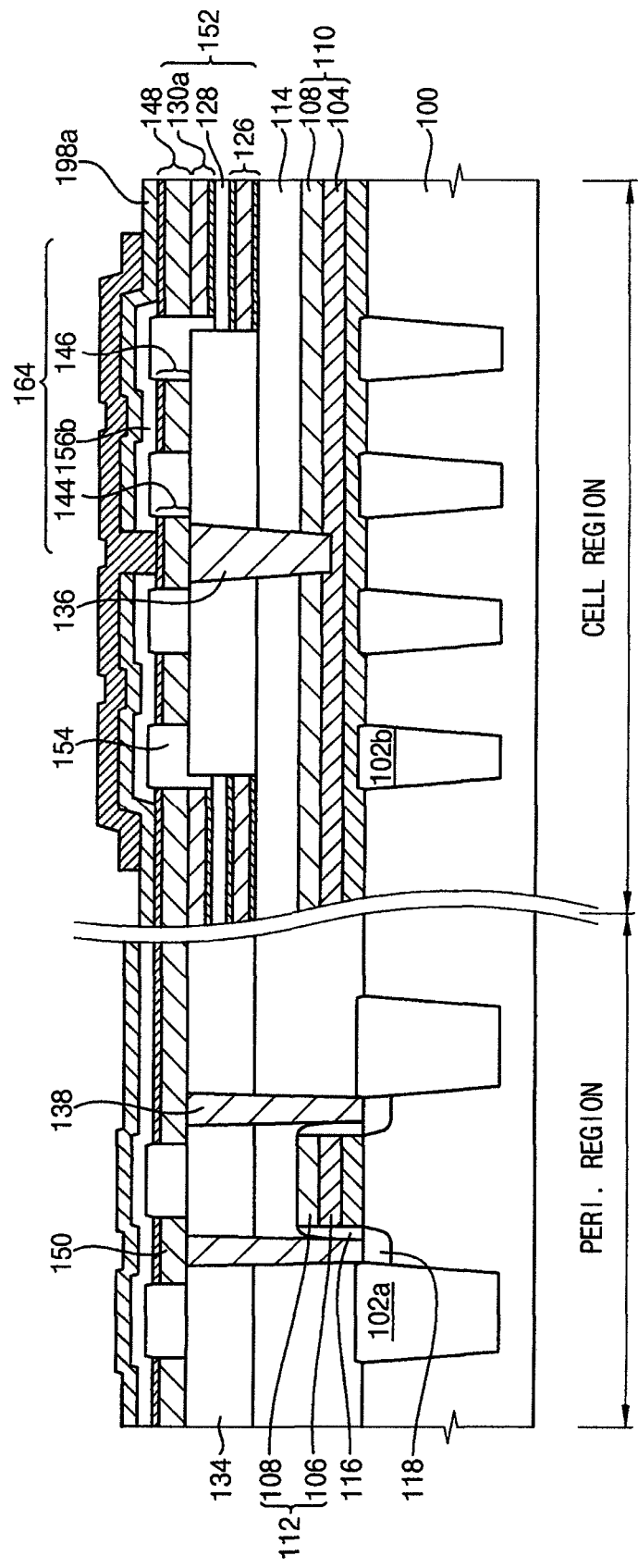
Figure 23B:
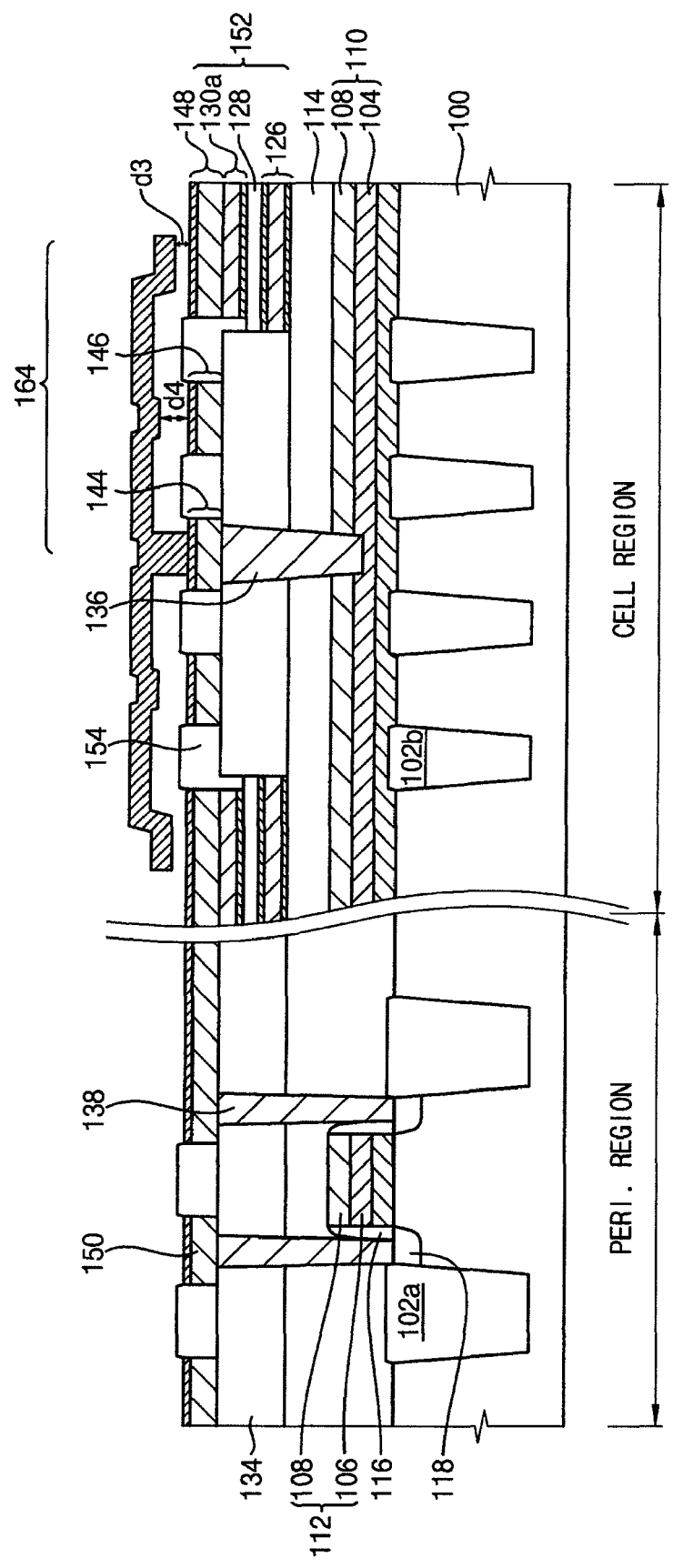

FIG. 21(*a*) through FIG. 23(*b*) show a method of forming an electromechanical switch having the dimpled gap according to an exemplary embodiment of the present invention.

Referring to FIG. 21(*a*) and FIG. 21(*b*), the first sacrificial layer 156 is formed on the conductive pad patterns 144, 148 and the word line 146. The first sacrificial layer 156 corresponding to the capacitor 152 is removed.

Figure 22A:
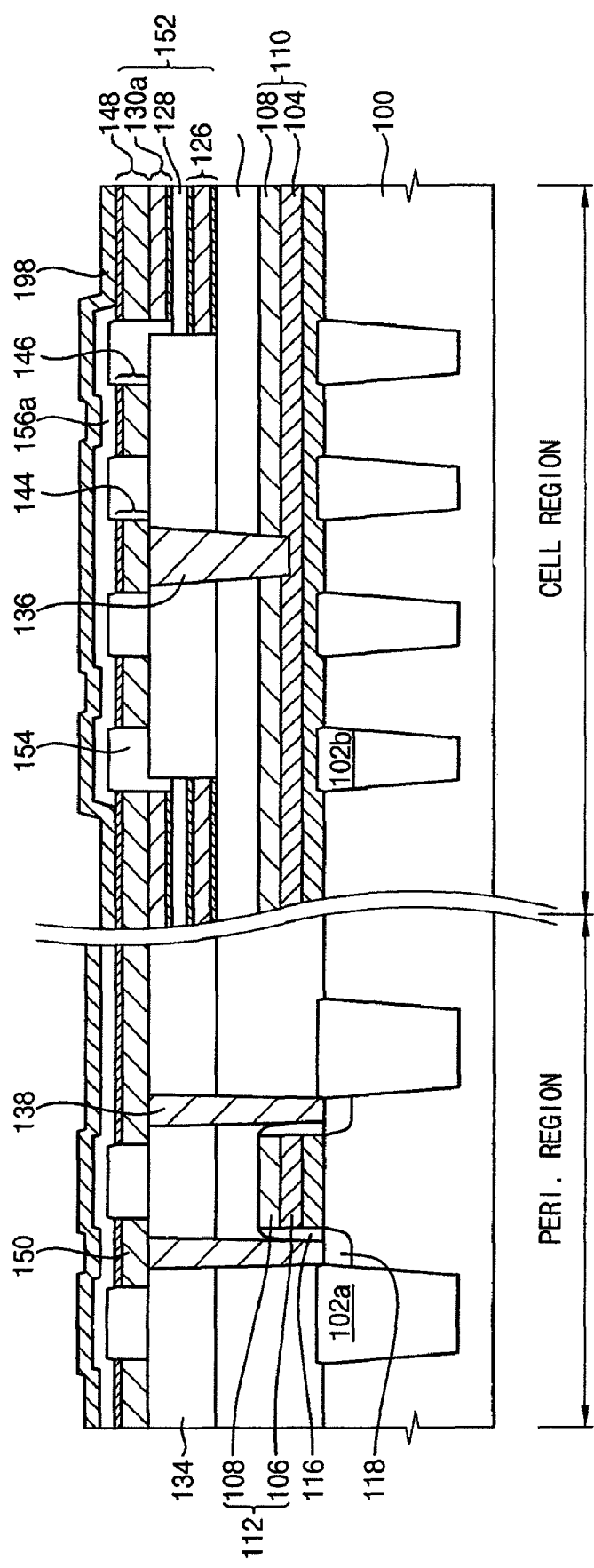
Figure 22B:
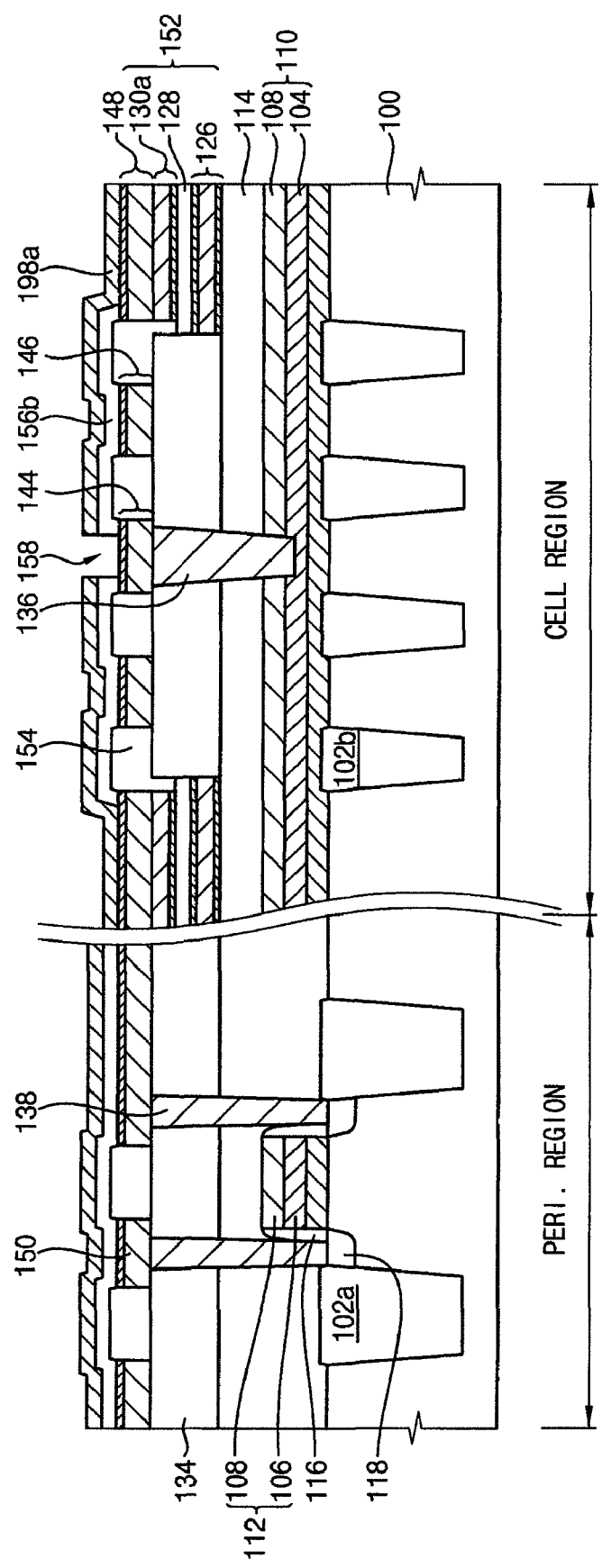

Referring to FIG. 22(*a*) and FIG. 22(*b*), a second sacrificial layer 158 is formed on the first sacrificial layer 156 and the conductive pad pattern 148 disposed on the capacitor 152. The first and second sacrificial layers 156, 198 corresponding to the contact plug 136 are etched to form an opening 158. The opening 158 exposes a top surface of the conductive pad pattern 144 disposed on the contact plug 136. The suspended beam line 164 is formed on the second sacrificial layer 198 and the exposed top surface of the conductive pad pattern 144.

Referring to FIG. 23(*a*) and FIG. 23(*b*), the first and second sacrificial layers 156, 198 are removed. As such, the suspended beam line 164 having distances d3 and d4 is formed. In an exemplary embodiment, d3 can be about 10 nm to about 15 nm, and d4 can be about 20 nm to about 25 nm.

Figure 24A:
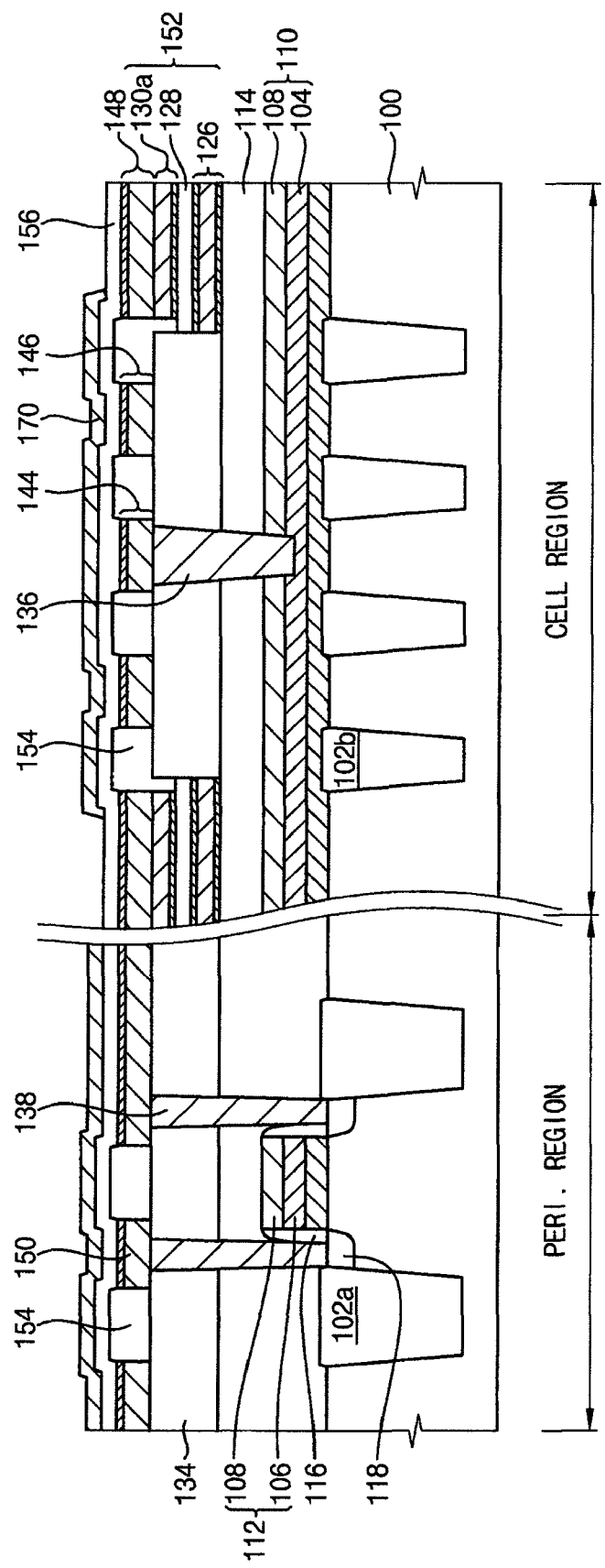
FIGS. 24(a) and 24(b) show a method of forming a sacrificial layer for an electromechanical switch having a dimpled gap according to an exemplary embodiment of the present invention.
Figure 24B:
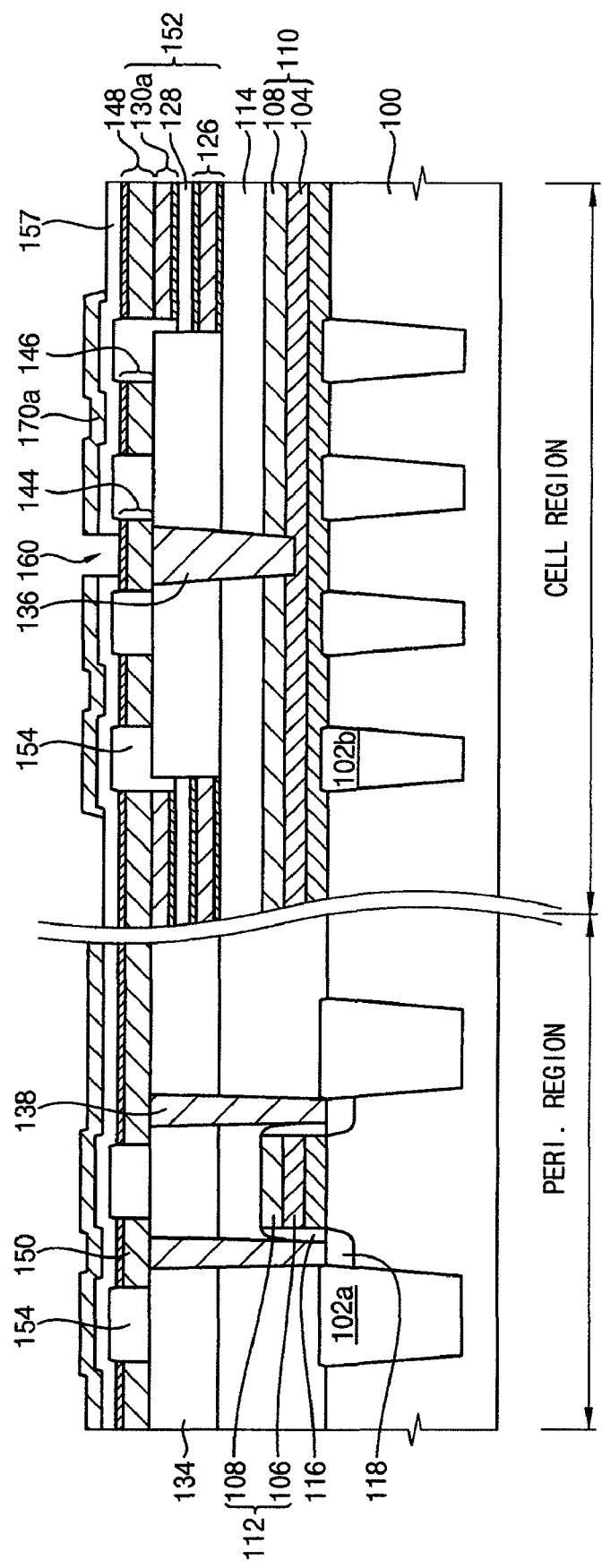

FIGS. 24(*a*) and 24(*b*) show a method of forming a sacrificial layer for an electromechanical switch having a dimpled gap according to an exemplary embodiment of the present invention.

Referring to FIGS. 24(*a*) and 24(*b*), the first sacrificial layer 156 is formed on the conductive pad patterns 144, 148 and the word line 146. Then, a second sacrificial layer 170 is formed on the first sacrificial layer 156. A portion of the second sacrificial layer 170 corresponding to the capacitor 152 is removed, thereby forming a second sacrificial layer pattern 170*a*. The opening 158 is formed to expose the top surface of the conductive pad pattern 144 on the contact plug 136. The suspended beam line 164 is formed on the second sacrificial layer 170 and in the opening 158. Then, the first and second sacrificial layers 156 and 170 are removed.

Figure 25A:
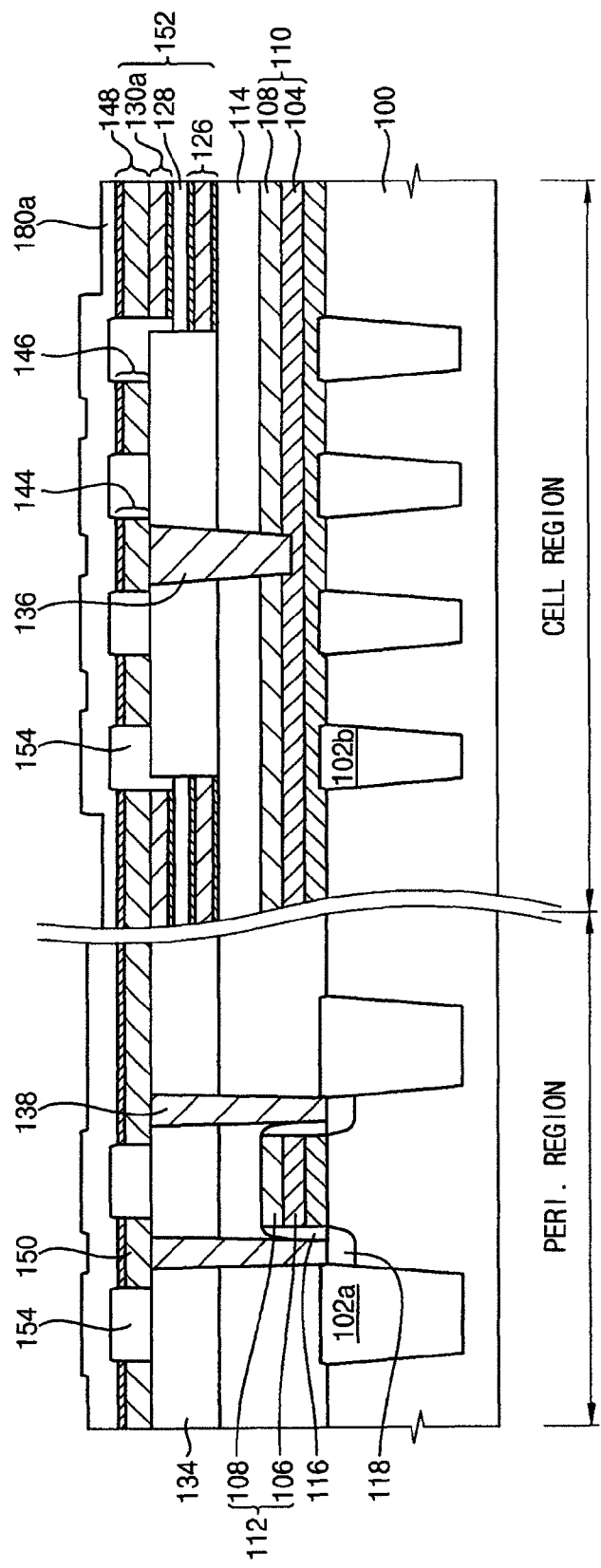
FIGS. 25(a) and 25(b) show a method of forming a sacrificial layer for an electromechanical switch having a dimpled gap according to an exemplary embodiment of the present invention.
Figure 25B:
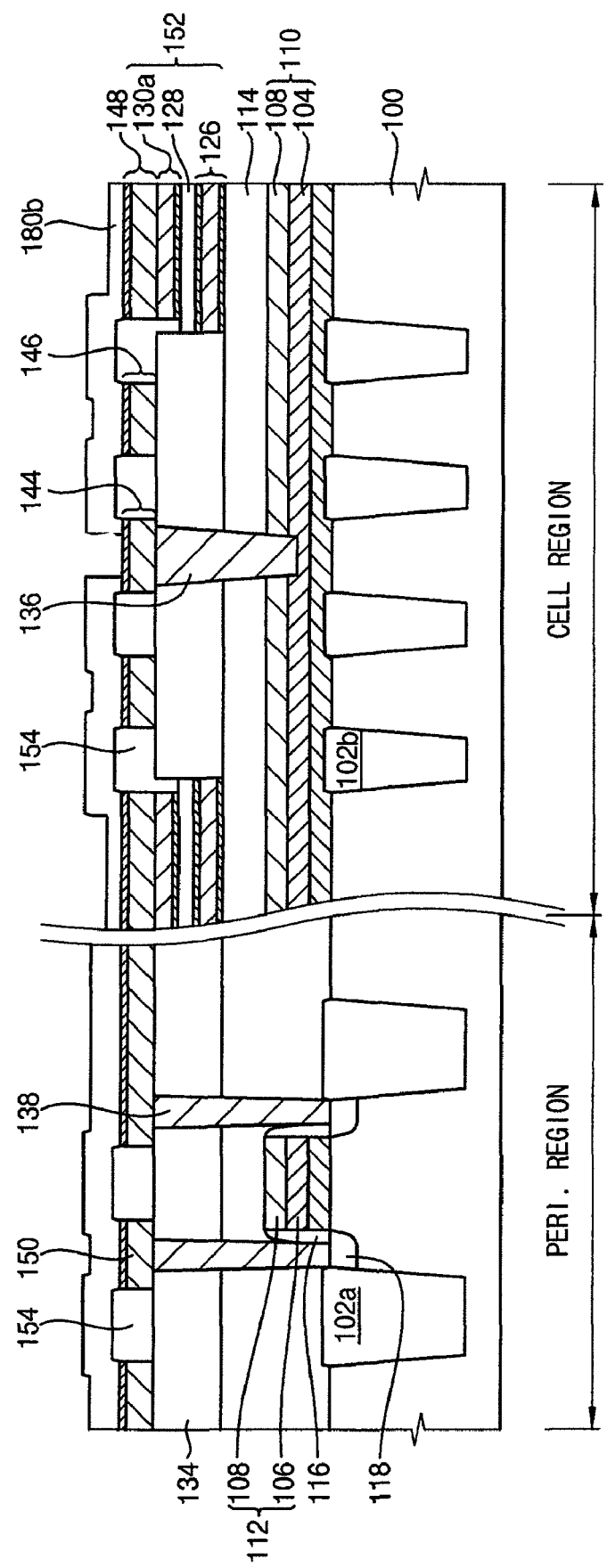

FIGS. 25(*a*) and 25(*b*) show a method of forming a sacrificial layer for an electromechanical switch having a dimpled gap according to an exemplary embodiment of the present invention.

Referring to FIGS. 25(*a*) and 25(*b*), a sacrificial layer 180 is formed on the conductive pad patterns 144, 148 and the word line 146. The portion of the sacrificial layer 180 corresponding to the capacitor 152 is thinner than the portion of the sacrificial layer 180 corresponding to the word line 146. The opening 158 is formed on the conductive pad pattern 144. The suspended beam line pattern 164 can be formed on the sacrificial layer 180 and in the opening 158. Then, the sacrificial layer 180 is removed.

Figure 26A:
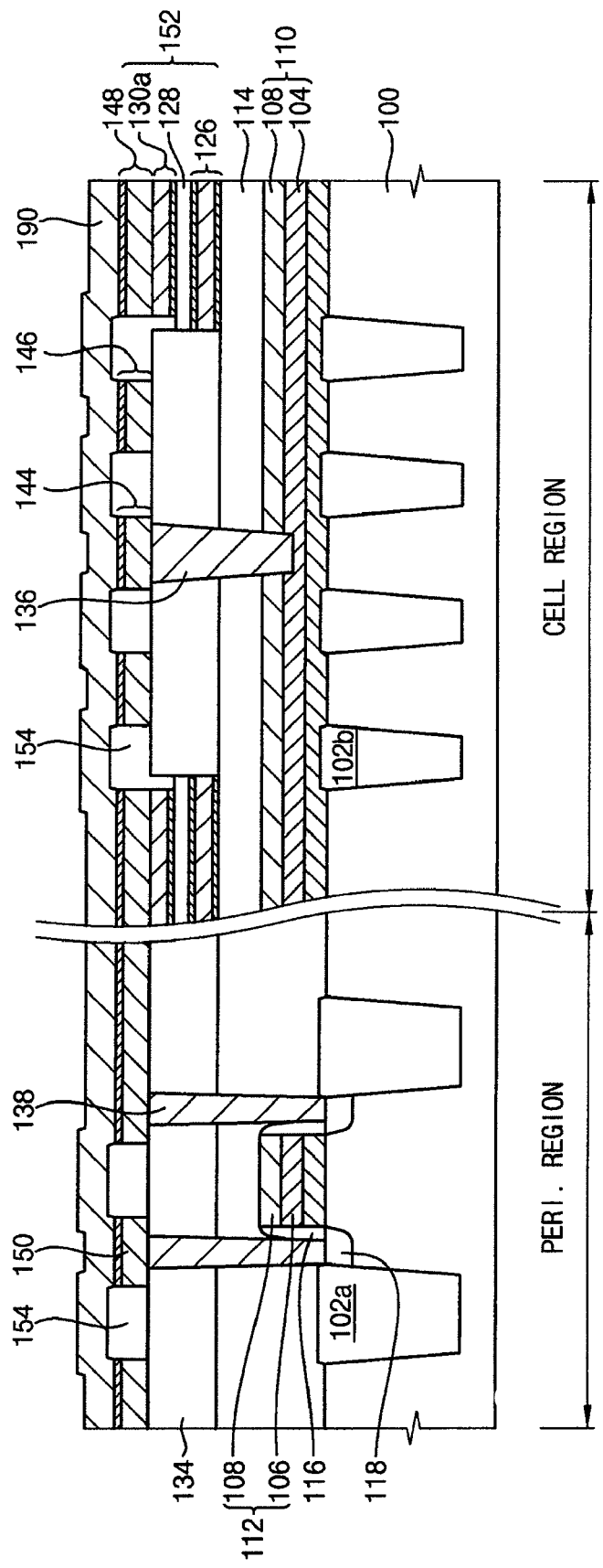
FIGS. 26(a) through 26(c) show a method of forming a sacrificial layer for an electromechanical switch having a dimpled gap according to an exemplary embodiment of the present invention.
Figure 26B:
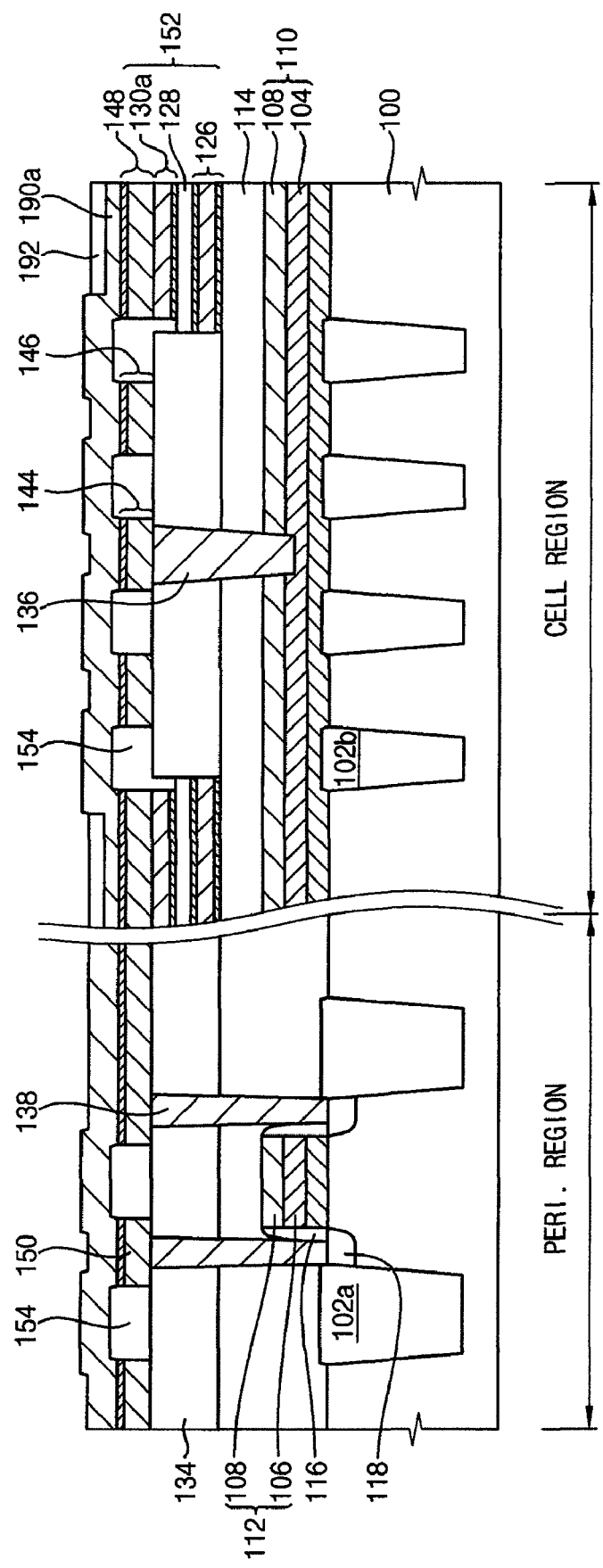
Figure 26C:
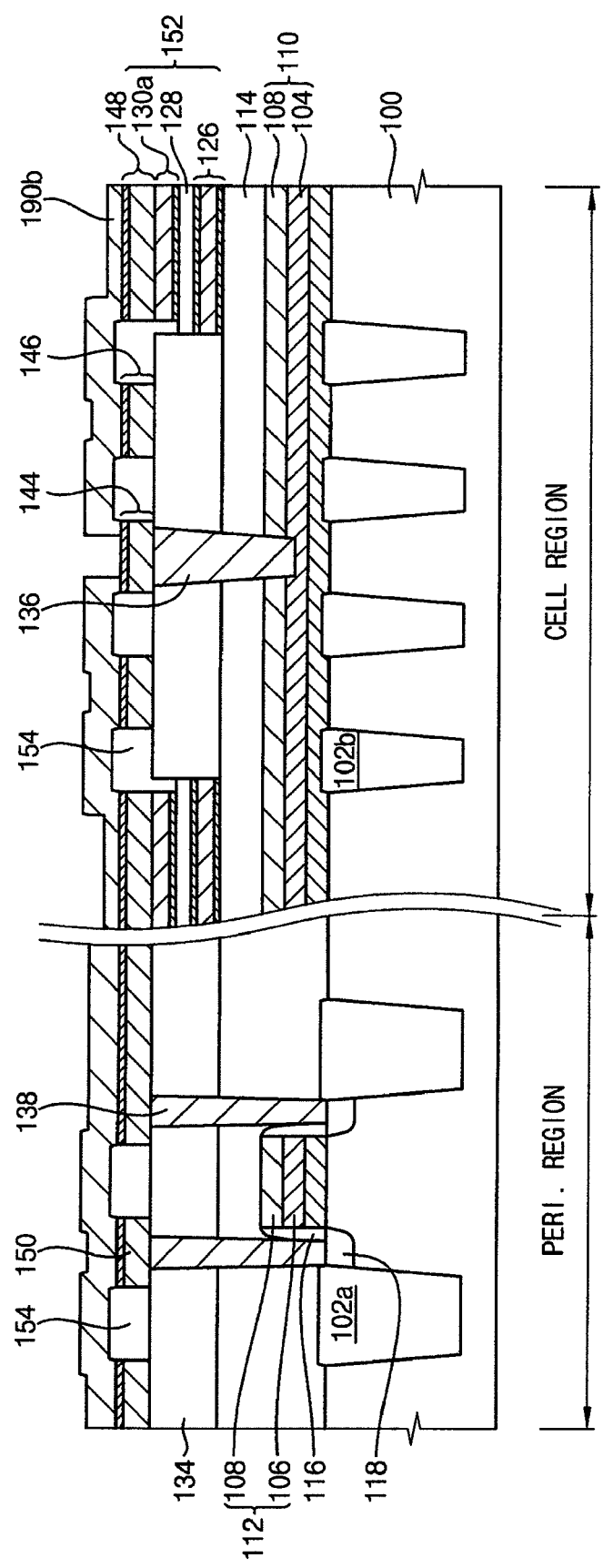

FIGS. 26(*a*) through 26(*c*) show a method of forming a sacrificial layer for an electromechanical switch having a dimpled gap according to an exemplary embodiment of the present invention.

Referring to FIG. 26 (*a*) through 26(*c*), a sacrificial layer 190 is formed on the conductive pad patterns 144 and 148 and the word line 146. The portion of the sacrificial layer 190 corresponding to the capacitor 152 is oxidized. The oxidized portion 192 of the sacrificial layer 190 is removed in a subsequent process. As such, the portion 190*b* of the sacrificial layer 190 becomes thinner. The opening 158 is formed on the conductive pad pattern 144. The suspended beam line 164 is formed on the sacrificial layer 190 and in the opening 158. Then, the sacrificial layer 190 is removed.

Figure 27:
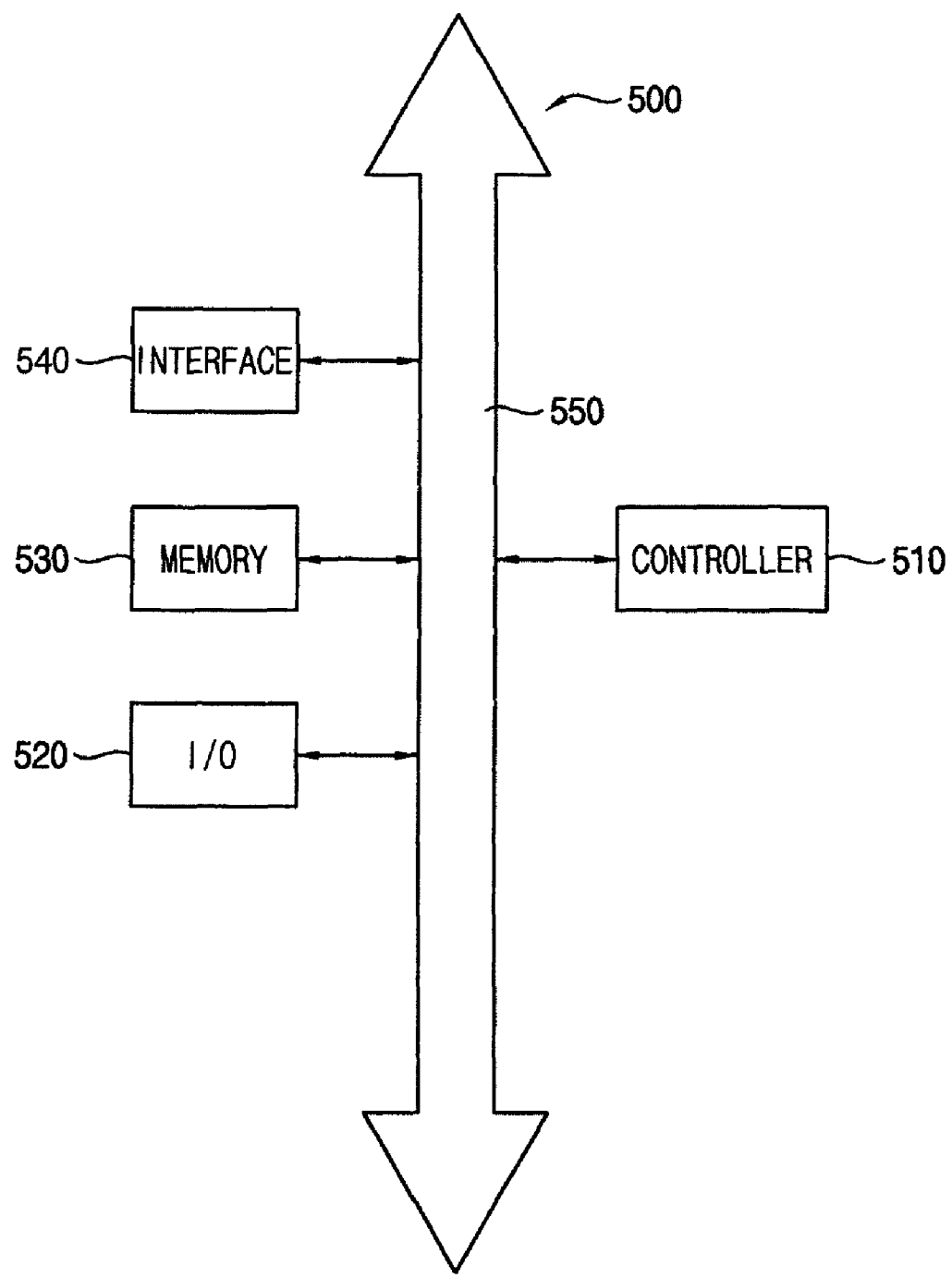
FIG. 27 shows a system including a memory device formed according to an exemplary embodiment of the present invention.

FIG. 27 shows a system comprising a memory device formed according to an exemplary embodiment of the present invention.

Referring to FIG. 27, a system 500 comprises a controller 510, an input/output device 520, a memory 530, an interface 540, and a bus 550. The system 500 may include a mobile system such as a personal data assistance (PDA), a portable computer, a web tablet, a wireless phone, a mobile phone, a digital music player, or a memory card. In an exemplary embodiment, the system 500 can be any system transmitting and/or receiving information. The controller 510 may include, for example, a microprocessor, a digital signal processor, or a microcontroller. The I/O device 520 may include a keypad, keyboard or display. The memory 530 can include, for example, a DRAM or a flash memory. The memory 530 can store commands executed by the controller 510. The memory 530 and the interface 540 can be combined by the bus 550. The system 500 can use the interface 540 to transmit data into a communication network or to receive data from the communication network.

Exemplary embodiments of the present invention provide a memory device having an electromechanical switch where good retention of charges is achieved due to the low or zero junction leakage in the electromechanical switch.

Exemplary embodiments of the present invention provide a memory device having an electromechanical switch where variety types of substrates can be used because the electromechanical switch can be formed on many different types of substrates.

Exemplary embodiments of the present invention provide a memory device having multiple arrays of memory cells that can be stacked. A high package density can be achieved in the multiple arrays because a substrate can be omitted in between the two adjacent arrays of memory cells.

Exemplary embodiments of the present invention provide an electromechanical switch using an electrode (e.g., a suspended beam line) as a part of the switch to open and close the circuit. As such, an additional switch element to open or close the circuit can be omitted.

Exemplary embodiments of the present invention provide a memory device having electromechanical switches which are smaller than the MOS transistors. As such, a size of the memory device according to exemplary embodiments of the present invention can be reduced.

Exemplary embodiments of the present invention provide a method of simultaneously forming electromechanical switches in the cell region and the peripheral region.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A memory device comprising:
a first pair of memory cells connected to a bit line, the first pair of memory cells having a first beam line; and
a second pair of memory cells formed adjacent to the first pair of memory cells and connected to the bit line, the second pair of memory cells having a second beam line, wherein each of the beam lines moves to connect to a respective storage node that stores a charge when a respective word line is energized, wherein the bit line and each of the beam lines are electrically connected through a respective contact plug, and each of the beam lines is substantially symmetrical with respect to the respective contact plug.

2. The memory device of claim 1, wherein each of the beam lines is anchored on the respective contact plug.

3. The memory device of claim 1, wherein a voltage sensing circuit is connected to an end of the bit line.

4. The memory device of claim 1, wherein an end of each of the beam lines moves from a first position to a second position for reading out the charge stored within the respective storage node or for writing the charge to the respective storage node.

5. The memory device of claim 4, wherein the end of each of the beam lines is in the second position to contact the respective storage node when the respective word line is energized.

6. The memory device of claim 4, wherein a first distance between the first position and the second position is substantially the same as a second distance between the respective word line and a corresponding portion of each of the beam lines.

7. The memory device of claim 5, wherein a first distance between the first position and the second position is smaller than a second distance between the respective word line and a corresponding portion of each of the beam lines.

8. The memory device of claim 1, wherein each of the beam lines comprises at least two layers.

9. The memory device of claim 1, wherein each of the beam lines is substantially shorter than the bit line.

10. The memory device of claim 1, wherein the respective word line is energized when a voltage is applied.

11. The memory device of claim 1, further comprising a substrate on which the bit line is formed, wherein the substrate comprises at least one of glass, semiconductor, or plastic.

12. The memory device of claim 1, wherein the respective storage node comprises a capacitor including a first electrode, a dielectric layer, and a second electrode.

13. The memory device of claim 12, wherein the first electrode receives the end of each of the beam lines and the second electrode is formed on a conductive plate.

14. The memory device of claim 1, wherein the respective storage node comprises a conductive pattern surrounded by an insulator.

15. The memory device of claim 1, further comprising a conductive plate on which the respective storage node is formed.

16. A memory device comprising:
a substrate;
a bit line formed on the substrate;
a word line formed on the bit line;
a beam line formed over the word line;
a capacitor storing a charge, the capacitor formed between the beam line and the substrate, wherein the beam line moves to connect to the capacitor when the word line is energized; and
a contact plug connecting the bit line and the beam line, wherein the beam line is substantially symmetrical with resect to the contact plug.

17. The memory device of claim 16, further comprising a first interlayer dielectric layer having a plurality of pores formed on the beam line.

18. The memory device of claim 17, further comprising a second interlayer dielectric layer formed on the first interlayer dielectric layer.

19. The memory device of claim 16, wherein a first end of the beam line moves from a first position to a second position for reading out the charge stored within the capacitor or for writing the charge to the capacitor.

20. The memory device of claim 19, wherein the first end of the beam line is in the second position to contact the capacitor when the word line is energized.

21. The memory device of claim 16, wherein a second end of the beam line is anchored on the contact plug.

22. The memory device of claim 19, wherein a first distance between the first position and the second position is substantially the same as a second distance between the word line and a corresponding portion of the beam line.

23. The memory device of claim 19, wherein a first distance between the first position and the second position is smaller than a second distance between the word line and a corresponding portion of the beam line.

24. The memory device of claim 16, wherein the beam line comprises at least two layers.

25. The memory device of claim 16, wherein the beam line is substantially shorter than the bit line.

26. The memory device of claim 16, wherein the word line is energized when a voltage is applied.

27. The memory device of claim 16, wherein the substrate comprises at least one of glass, semiconductor, or plastic.

28. The memory device of claim 16, wherein the capacitor includes a first electrode, a dielectric layer, and a second electrode.

29. The memory device of claim 28, wherein the first electrode receives the first end of the beam line and the second electrode is formed on a conductive plate.

30. The memory device of claim 16, further comprising a conductive plate on which the capacitor is formed.

31. A memory device comprising:
a substrate;
a bit line formed on the substrate;
a word line formed on the bit line;
a beam line formed over the word line;
a capacitor storing a charge, the capacitor formed between the beam line and the substrate, wherein the beam line moves to connect to the capacitor when the word line is energized; and
an interlayer dielectric layer having a plurality of pores formed on the beam line.

32. A memory device comprising:
a first pair of memory cells connected to a bit line, the first pair of memory cells having a first beam line;
a second pair of memory cells formed adjacent to the first pair of memory cells and connected to the bit line, the second pair of memory cells having a second beam line, wherein each of the beam lines moves to connect to a respective storage node that stores a charge when a respective word line is energized; an interlayer dielectric layer having a plurality of pores formed on the first and second beam lines.

* * * * *